(12) United States Patent
Pan et al.

(10) Patent No.: US 7,323,952 B2
(45) Date of Patent: Jan. 29, 2008

(54) BREATH-MODE RING RESONATOR STRUCTURE, AND METHOD OF DESIGNING, OPERATING AND USING SAME

(75) Inventors: Zhiyu Pan, San Jose, CA (US); Aaron Partridge, Palo Alto, CA (US); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 206 days.

(21) Appl. No.: 11/219,569

(22) Filed: Sep. 2, 2005

(65) Prior Publication Data

US 2007/0052498 A1    Mar. 8, 2007

(51) Int. Cl.
*H03H 9/46* (2006.01)
*H03H 9/48* (2006.01)

(52) U.S. Cl. ................. 333/186; 333/199; 333/198

(58) Field of Classification Search ............... 333/186
See application file for complete search history.

(56) References Cited

U.S. PATENT DOCUMENTS

| | | | |
|---|---|---|---|
| 6,249,073 B1 | 6/2001 | Nguyen et al. |
| 6,452,465 B1 | 9/2002 | Brown et al. |
| 6,577,040 B2 | 6/2003 | Nguyen |
| 6,624,726 B2 | 9/2003 | Niu et al. |
| 6,628,177 B2 | 9/2003 | Clark et al. |
| 6,856,217 B1 | 2/2005 | Clark et al. |
| 6,894,586 B2 | 5/2005 | Bircumshaw et al. |
| 2002/0041220 A1 | 4/2002 | Nguyen |
| 2002/0105393 A1 | 8/2002 | Clark et al. |
| 2004/0085159 A1 | 5/2004 | Kubena et al. |

(Continued)

FOREIGN PATENT DOCUMENTS

WO    WO 2004/083781    9/2004

(Continued)

OTHER PUBLICATIONS

"Mechanically Corner-Coupled Square Microresonator Array for Reduced Series Motional Resistance", Demirci et al., Dig. of Tech. Papers, the 12th Int. Conf. on Solid-State Sensors & Actuators (Transducers '03), Boston, Massachussets, Jun. 8-12, 2003, pp. 955-958.

(Continued)

*Primary Examiner*—Barbara Summons
(74) *Attorney, Agent, or Firm*—Kenyon & Kenyon LLP

(57) ABSTRACT

There are many inventions described and illustrated herein, as well as many aspects and embodiments of those inventions. In one aspect, the present invention is directed to one or more microelectromechanical ring resonator structures having a circular or substantially circular outer surface and a circular or substantially circular inner surface. The microelectromechanical ring resonator(s) include an anchor support element having an impedance matching structure coupled to at least one substrate anchor. The impedance matching structure may be a beam, having a predetermined length, which couples the ring resonator(s) to substrate anchor. In one embodiment, the impedance matching structure operates in a bulk-elongation mode. In another embodiment, the impedance matching structure operates in a flexure mode. In operation, when induced, the microelectromechanical ring resonator structure oscillates in an elongating/compressing or breathing mode (or in a primarily or substantially elongating or breathing mode). In this regard, the ring resonator structure exhibits an elongating/compressing-like or breathing-like motion.

18 Claims, 26 Drawing Sheets

U.S. PATENT DOCUMENTS

| | | | |
|---|---|---|---|
| 2004/0095210 | A1 | 5/2004 | Nguyen |
| 2004/0113722 | A1 | 6/2004 | Bircumshaw et al. |
| 2004/0207492 | A1 | 10/2004 | Nguyen et al. |
| 2005/0073078 | A1 | 4/2005 | Lutz et al. |
| 2005/0174197 | A1 | 8/2005 | Nguyen et al. |
| 2005/0206479 | A1 | 9/2005 | Nguyen et al. |
| 2007/0046398 | A1* | 3/2007 | Nguyen et al. ............. 333/186 |
| 2007/0103258 | A1* | 5/2007 | Weinstein et al. .......... 333/186 |

FOREIGN PATENT DOCUMENTS

WO    WO 2005/015735    2/2005

OTHER PUBLICATIONS

"High-Q Single Crystal Silicon HARPSS Capacitive Beam Resonators with Self-Aligned Sub- 100nm Transduction Gaps", Pourkamali et al., Journal of Microelectromechanical Systems, vol. 12, No. 4, Aug. 2003, pp. 487-496.

"A High Aspect-Ratio Polysilicon Vibrating Ring Gyroscope", Ayazi et al., Solid-State Sensor and Actuator Workshop, Hilton Head Island, South Carolina, Jun. 4-8, 2000, pp. 289-292.

"Shape Effect on Mechanical Quality Factor of Micro-Resonator", Kobayashi et al., Micro Electro Mechanical Systems, 1998, MEMS 98, Proceedings, The Eleventh Annual International Workshop of Heidelberg, Germany Jan. 25-29, 1998, New York, NY, USA, IEEE US, Jan. 25, 1998, pp. 195-200.

"Micromechanical Hollow-Disk Ring Resonators", Li et al., Micro Electro Mechanical Systems, 2004, 17th IEEE International Conference on MEMS, Maastricht, Netherlands Jan. 25-29, 2004, Piscataway, NJ, USA, IEEE, US, Jan. 25, 2004, pp. 821-824.

"UHF Micromechanical Extensional Wine-Glass Mode Ring Resonators", Xie et al., International Electron Devices Meeting 2003, IEDM, Technical Digest, Washington, DC, Dec. 8-10, 2003, New York, NY, IEEE US, Dec. 8, 2003, pp. 953-956.

"Low Motional Resistance Ring-Shaped Contour-Mode Aluminum Nitride Piezoelectric Micromechanical Resonators for UHF Applications", Piazza et al., Micro Electro Mechanical Systems, 2005, MEMS 2005, 18th IEEE International Conference on Miami Beach FL, USA, Jan. 30-Feb. 3, 2005, Piscataway, NJ, USA, IEEE Jan. 30, 2005, pp. 20-23.

"Integrated HF CMOS-MEMS Square-Frame Resonators with On-Chip Electronics and Electrothermal Narrow Gap Mechanism", Lo et al., Solid-State Sensors, Actuators and Microsystems, 2005, Digest of Technical Papers, Transducers '05, The 13th International Conference on Seoul, Korea, Jun. 5-9, 2005, Piscataway, NJ, USA, IEEE, Jun. 5, 2005, pp. 2074-2077.

"Vibrating RF MEMS for Next Generation Wireless Applications", Nguyen, Custom Integrated Circuits Conference, 2004, Proceedings of the IEEE 2004, Orlando, FL, USA, Oct. 3-6, 2004, Piscataway, NJ, USA, IEEE, Oct. 3, 2004, pp. 257-264.

"Fully-Differential Poly-SiC Lame-Mode Resonator and Checkerboard Filter", Bhave et al., Micro Electro Mechanical Systems, 205, MEMS 2005, 18th IEEE International Conference on Miami Beach, FL, USA, Jan. 30-Feb. 3, 2005, Piscataway, NJ, USA, IEEE Jan. 30, 2005, pp. 22-226.

"The Radial Bulk Annular Resonator: Towards a 50Ω RF MEMS Filter", Bircumshaw et al., The 12th International Conference on Solid State Sensors, Actuators and Microsystems, Boston, Jun. 8-12, 2003, pp. 875-878.

\* cited by examiner

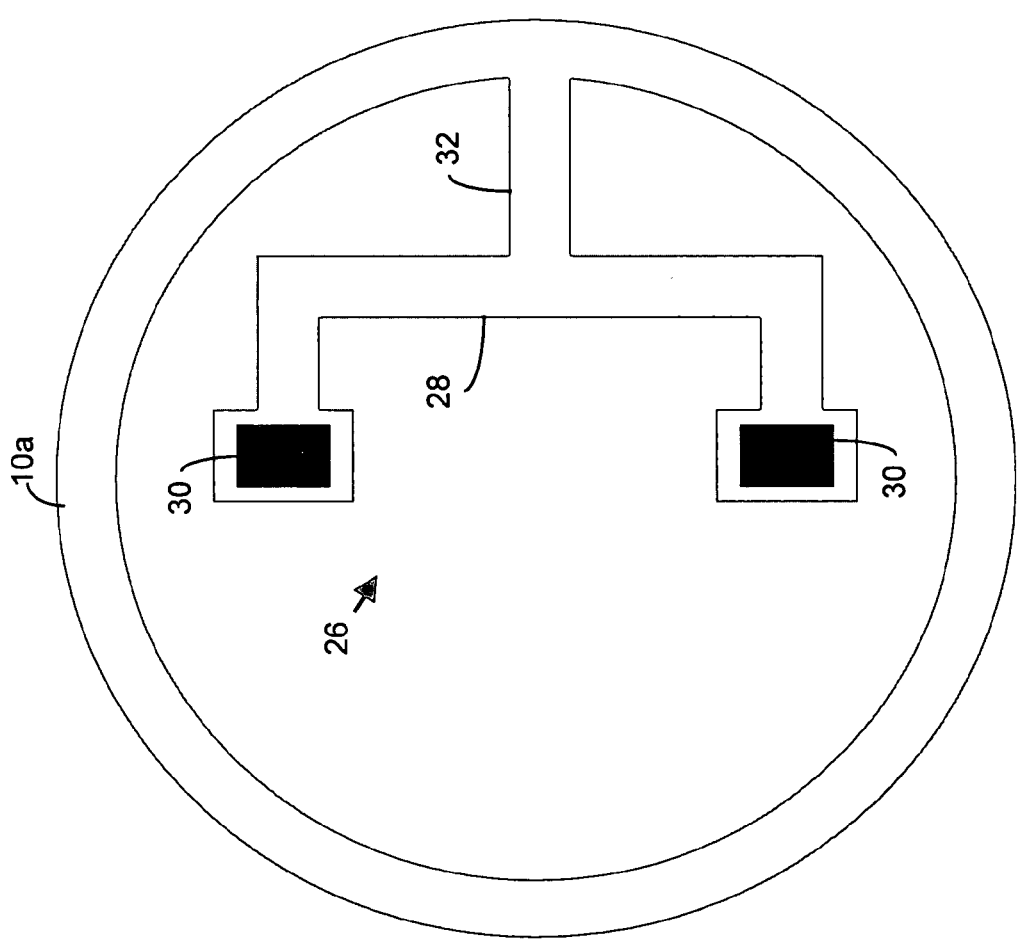

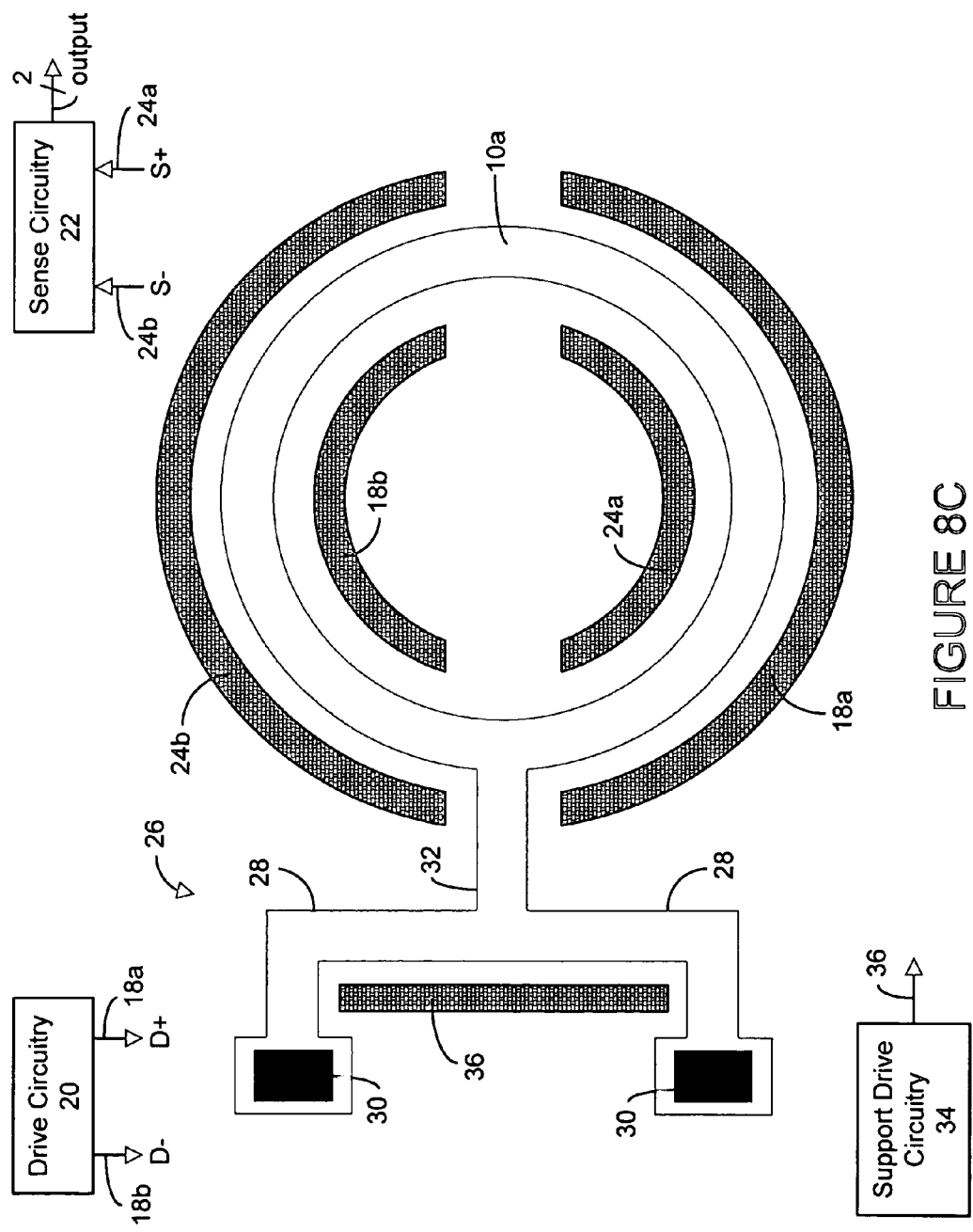

BREATH-MODE RING RESONATOR STRUCTURE, AND METHOD OF DESIGNING, OPERATING AND USING SAME

BACKGROUND

This invention relates to a microelectromechanical or nanoelectromechanical resonator architecture or structure, and method of designing, operating, controlling and/or using such a resonator; and more particularly, in one aspect, to a microelectromechanical or nanoelectromechanical resonator architecture or structure having a ring-like shape wherein the resonator, when induced, resonates in primarily or substantially an elongating or breathing mode or motion.

Generally, high Q microelectromechanical resonators are regarded as a promising choice for integrated single chip frequency references and filter. In this regard, high Q microelectromechanical resonators tend to provide high frequency outputs that are suitable for many high frequency applications requiring compact and/or demanding space constrained designs. However, while the resonator is being scaled smaller, packaging stress, energy loss into the substrate through substrate anchors and/or reduced signal strength tend to adversely impact the frequency stability as well as "Q" of the resonator.

There are several well-known resonator architectures. For example, one group of conventional resonator architectures employs a closed-ended or an open-ended tuning fork. For example, a closed-ended or double-clamped tuning fork resonator includes beams or tines that are anchored to substrate via anchors. The tuning fork architecture employs fixed electrodes to induce a force to or on the beams/tines to cause or induce the beams/tines to oscillate (in-plane).

The characteristics and response of tuning fork resonators are well known. However, such resonator architectures are often susceptible to changes in mechanical frequency of resonator by inducing strain into resonator beams/tines as a result of packaging stress. In addition, such conventional resonator architectures typically experience or exhibit energy loss, through the anchors, into the substrate.

Moreover, the characteristics and response of such conventional resonators are highly susceptible and/or influenced by manufacturing tolerances of conventional manufacturing processes (for example, photolithography and/or etching processes). Accordingly, manufacturing conventional resonators having a precise resonant frequency, on a repeatable and predictable basis, is challenging.

Certain architectures and techniques have been described to address Q-limiting loss mechanism of energy loss into the substrate through anchors as well as changes in frequency due to certain stresses. In one embodiment, the beams of the resonator may be "suspended" above the ground plane and sense electrode whereby the vibration mode of the beam is out-of-plane. (See, for example, U.S. Pat. No. 6,249,073). While such architectures may alleviate energy loss through the anchors, resonators that include an out-of-plane vibration mode (i.e., transverse mode) tend to exhibit relatively large parasitic capacitance between drive/sense electrodes and the substrate. Such capacitance may lead to a higher noise floor of the output signal (in certain designs).

Other techniques designed to improve the Q-factor of the resonator have been proposed and include designing the spacing between the vibrating beams so that such beams are closely spaced relative to a wavelength associated with their vibrating frequency. (See, for example, the single-ended or single-clamped resonator of U.S. Pat. No. 6,624,726). The vibrating beams are driven to vibrate one-half of a vibration period out of phase with each other (i.e., to mirror each other's motion). While these architectures and techniques to improve the Q of the resonator may suppress acoustic energy leakage, such an architecture remains predisposed to packaging stress, energy loss into the substrate through substrate anchors as well as a "moving" of the center of gravity of the resonator during motion by the vibrating beams of the single-ended or single-clamped resonator.

Other resonator architectures have been described to address energy loss through the anchor, for example, a "disk" shaped resonator design. (See, for example, U.S. Patent Application Publication 2004/0207492 and U.S. Pat. No. 6,628,177). Yet another resonator architecture has been proposed that is a "hollow-disk" ring resonator design. (See "Micromechanical "Hollow-Disk" Ring Resonator", Li et al., MEMS 2004 (IEEE), pages 821-825). In this design, it is stated that, among other things, the anchor technique employed therein suppresses energy loss through the anchor which allows the annular ring-type resonator to achieve a high Q.

Notably, as mentioned above, the characteristics and response of conventional resonators are highly susceptible and/or influenced by manufacturing tolerances of conventional fabrication processes (for example, photolithography and/or etching processes). As such, these tolerances and/or imperfections may have a dramatic impact on the resulting mechanical frequency of the resonator.

Thus, there is a need for a resonator architecture, configurations or structure, and method of designing, operating, controlling and/or using such a resonator that overcomes the shortcomings of one, some or all of the conventional microelectromechanical resonator architectures, configurations or structures. In this regard, there is a need for improved microelectromechanical and/or nanoelectromechanical resonators having improved packaging stress characteristics, reduced energy loss (i) into the substrate through substrate anchors and/or (ii) due to thermo elastic dissipation (TED), improved immunity to tolerances in the manufacturing processes (for example, photolithography and/or etching processes), and/or greater predictability and repeatability of the resonant frequency. In this way, the predictability, repeatability, stability and/or linearity of the output frequency of the resonator is enhanced and/or the "Q" factor of the resonator is relatively high.

SUMMARY OF THE INVENTION

There are many inventions described and illustrated herein, as well as many aspects and embodiments of those inventions. In a first principal aspect, a microelectromechanical resonator structure includes a MEMS ring resonator including a MEMS ring resonator structure having an outer surface, wherein the outer surface includes a circular or substantially circular shape having an outer radius of curvature, and an inner surface, wherein the inner surface includes a circular or substantially circular shape having an inner radius of curvature. The MEMS ring resonator further includes an anchor support element including an impedance matching structure wherein, in operation, the MEMS ring resonator structure oscillates in an elongating/compressing mode.

In one embodiment, the impedance matching structure is a beam that extends from the outer surface. The beam may include a length that is or is about one fourth of the length of the MEMS ring resonator structure. The MEMS ring resonator may include at least one substrate anchor connected to a distal end of the impedance matching structure to secure the impedance matching structure to the substrate. In operation, the impedance matching structure (here, the beam) resonates in a bulk-elongation mode.

In another embodiment, the MEMS ring resonator includes a coupling beam, disposed between the impedance matching structure and the outer surface of the MEMS ring resonator structure, wherein the impedance matching structure, in operation, resonates in a flexure mode. In this embodiment, the impedance matching structure flexes in-phase with the oscillation of the MEMS ring resonator structure. The MEMS ring resonator may include at least one substrate anchor connected to a distal end of the impedance matching structure to secure the impedance matching structure to the substrate.

In another principal aspect, the present invention is a MEMS ring resonator comprising a MEMS ring resonator structure including an outer surface, wherein the outer surface includes a circular or substantially circular shape having a radius of curvature, and an inner surface, wherein the inner surface includes a circular or substantially circular shape having a radius of curvature. The MEMS ring resonator further includes an anchor support element including an impedance matching structure. In operation, the MEMS ring resonator structure oscillates in an elongating/compressing mode. The MEMS ring resonator further includes at least one sense electrode and at least one drive electrode, wherein the sense and drive electrodes are juxtaposed one of the surfaces of the MEMS ring resonator structure. Sense circuitry, coupled to the sense electrodes, provides an output signal.

In one embodiment, the MEMS ring resonator includes at least one sense electrode to provide one or more signals to the sense circuitry which, in response, provides a differential output signal. In another embodiment, the MEMS ring resonator includes at least one sense electrode to provide one or more signals to the sense circuitry which, in response, provides a single ended output signal.

The impedance matching structure may be a beam that extends from the outer surface. The beam may include a length that is or is about one fourth of the length of the MEMS ring resonator structure. The MEMS ring resonator may include at least one substrate anchor connected to a distal end of the impedance matching structure to secure the impedance matching structure to the substrate. In operation, the impedance matching structure (here, the beam) resonates in a bulk-elongation mode.

In another embodiment, the MEMS ring resonator includes a coupling beam, disposed between the impedance matching structure and the outer surface of the MEMS ring resonator structure, wherein the impedance matching structure, in operation, resonates in a flexure mode. In this embodiment, the impedance matching structure flexes in-phase with the oscillation of the MEMS ring resonator structure. The MEMS ring resonator may include at least one substrate anchor connected to a distal end of the impedance matching structure to secure the impedance matching structure to the substrate.

Again, there are many inventions, and aspects of the inventions, described and illustrated herein. This Summary of the Invention is not exhaustive of the scope of the present inventions. Moreover, this Summary of the Invention is not intended to be limiting of the invention and should not be interpreted in that manner. While certain embodiments have been described and/or outlined in this Summary of the Invention, it should be understood that the present invention is not limited to such embodiments, description and/or outline. Indeed, many others embodiments, which may be different from and/or similar to, the embodiments presented in this Summary, will be apparent from the description, illustrations and claims, which follow. In addition, although various features, attributes and advantages have been described in this Summary of the Invention and/or are apparent in light thereof, it should be understood that such features, attributes and advantages are not required whether in one, some or all of the embodiments of the present inventions and, indeed, need not be present in any of the embodiments of the present invention.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 4C and 4D illustrate top views of an exemplary ring microelectromechanical resonator according to certain embodiments of the present inventions wherein the ring microelectromechanical resonator is anchored to the substrate using anchoring techniques and/or configurations that employ an impedance matching structure resonant in a flexural mode;

FIGS. 6A-6K illustrate top views of an exemplary ring microelectromechanical resonator according to certain embodiments of the present inventions wherein the ring microelectromechanical resonator is anchored to the substrate using various anchoring techniques and/or configurations that employ a plurality of impedance matching structures that resonant in bulk-longitudinal mode and/or flexural mode;

FIGS. 8A-8C illustrate top views of exemplary ring microelectromechanical resonators according to certain embodiments of the present inventions, in conjunction with drive and sense electrodes and certain anchoring techniques and/or configurations that employ an impedance matching structure resonant in a flexural mode, according to certain embodiments of the present inventions.

DETAILED DESCRIPTION

There are many inventions described and illustrated herein, as well as many aspects and embodiments of those inventions. In one aspect, the present invention is directed to a microelectromechanical ring resonator including a ring resonator structure having a circular or substantially circular outer surface and a circular or substantially circular inner surface. In operation, when induced, the microelectromechanical ring resonator structure oscillates in an elongating/compressing or breathing mode (or in a primarily or substantially elongating/compressing or breathing mode). In this regard, the ring resonator structure exhibits an elongating/compressing-like or breathing-like motion.

The microelectromechanical ring resonator may be anchored to the substrate using a variety of configurations, structures and/or architectures. In one embodiment, one or more anchor support structures, having an impedance matching structure, secure, fix and/or connect microelectromechanical ring resonator structure to the substrate. The impedance matching structure may be a beam, having a predetermined length, which operates (i) in a bulk-elongation mode or (ii) in a flexure mode to manage, control, reduce, eliminate and/or minimize loading on microelectromechanical ring resonator structure. In this way, in operation, anchor support element "matches" (or substantially "matches") the elongation/compression motion and/or frequency of the microelectromechanical ring resonator structure, thereby allowing the resonator structure to oscillate or vibrate in its "natural" mode-shape and frequency whereby all portions of the structure may expand/contract in a uniform/consistent or substantially uniform/consistent elongating or breathing motion.

Notably, the present inventions are described in the context of microelectromechanical systems. The present inventions, however, are not limited in this regard. Rather, the inventions described herein are applicable to, for example, nanoelectromechanical systems. Thus, the present inventions are pertinent to microelectromechanical and nanoelectromechanical systems (hereinafter collectively "MEMS" unless specifically noted to the contrary), for example, gyroscopes, resonators, and/or accelerometers, implementing one or more of the resonator architectures of the present inventions.

Figure 1A:
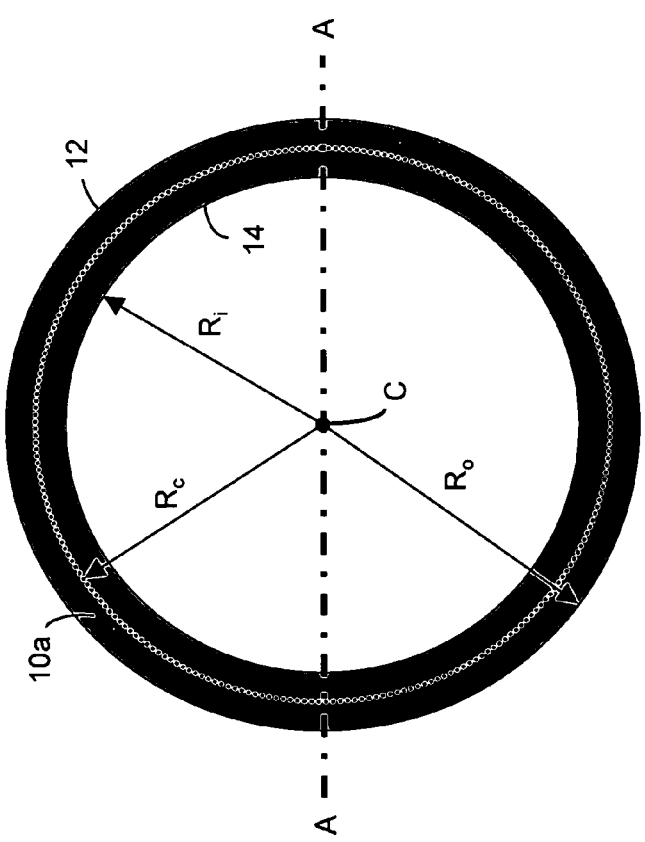
FIG. 1A is a top view of one embodiment of a ring microelectromechanical resonator having an inner radius ($R_i$), a center radius ($R_c$), and an outer radius ($R_o$), according to one embodiment of one aspect of the present inventions.
Figure 1B:
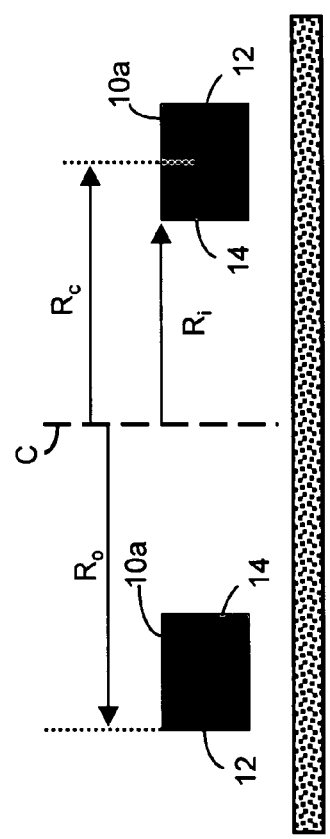
FIG. 1B is a cross-sectional view of the ring microelectromechanical resonator of FIG. 1A (sectioned along dotted line A-A of FIG. 1A) and includes designations of the inner radius ($R_i$), a center radius ($R_c$), and an outer radius ($R_o$)

With reference to FIGS. 1A and 1B, in one embodiment, MEMS ring resonator 10 includes a MEMS ring resonator 10a having a circular or substantially circular outer surface 12 and a circular or substantially circular inner surface 14. The MEMS ring resonator structure 10a is disposed above substrate 16. The circular or substantially circular outer surface 12 has a radius of curvature of $R_o$. The circular or substantially circular inner surface 14 has a radius of curvature of $R_i$. The radii of curvature are measured relative to a "center" C of the ring structure 10a of MEMS ring resonator 10.

The MEMS ring resonator structure 10a further includes a center radius of curvature of $R_c$, which may be characterized as the average of radius of curvature between the inner and outer radii of curvature ($R_i$ and $R_o$, respectively) relative to the "center" C of the ring structure 10a of MEMS ring resonator 10. Notably, each radius of curvature may include tolerances such that the radius of curvature of a surface or region is not constant but may vary between different areas of the ring structure.

To at least a first order, the resonant frequency of MEMS ring resonator 10 may be characterized with respect to the center radius of curvature ($R_c$) as:

$$f = \frac{1}{2\cdot\pi}\cdot\sqrt{\frac{E}{\rho R_c^2}} \quad \text{EQUATION 1}$$

where:
E=Young's modulus
ρ=mass density of the resonator's material(s)
$R_c$=center radius of curvature of the resonator As such, to at least the first order, the resonant frequency may be independent of the width or thickness of the ring structure (i.e., $R_o-R_i$). In this way, the effect of tolerances or variations in the manufacturing processes (for example, photolithography and/or etching processes) may be reduced or minimized (relative to conventional structures) because such tolerances would tend to impact the ring structure equally. For example, such fabrication tolerances or variations impact the outer and inner radii of the ring structure in opposite directions (for example, more or greater undercut than anticipated/designed may reduce the outer radius and increase the inner radius equally and in an offsetting manner) thereby providing a constant or substantially constant, predetermined and/or constant center radius when subjected to such fabrication tolerances or variations.

Notably, the dimensions, characteristics and/or parameters of a MEMS resonator structure 10a according to the present invention may be determined using a variety of techniques including modeling and simulation techniques (for example, a finite element modeling and/or simulation process implemented via a computer driven analysis engine, such as FemLab (from Consol), ANSYS (ANSYS INC.), IDEAS and/or ABAKUS) and/or empirical data/measurements. For example, a finite element analysis engine, using or based on a set of boundary conditions (for example, the size of the resonator structure), may be employed to determine and assess the dimensions, characteristics and/or parameters of (i) outer radius of outer surface 12, (ii) inner radius of inner surface 14, and (iii) other components, characteristics, aspects and/or properties of the resonator structure that are discussed below.

Figure 2B:
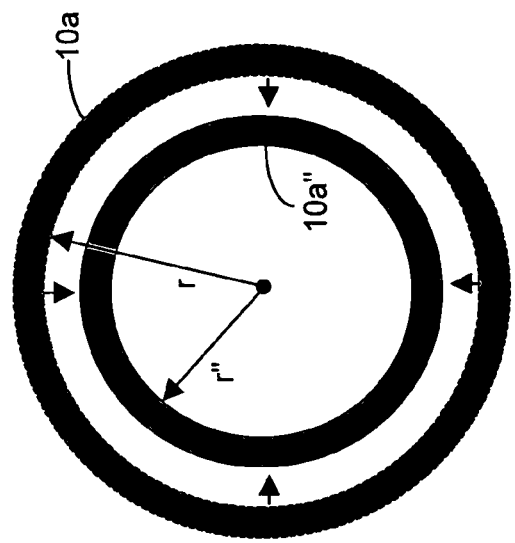
FIGS. 2A and 2B are top views of a ring oscillator that is oscillating in plane in a breathing-like mode or motion, wherein the ring resonator expands (FIG. 2A) and contracts (FIG. 2B) in relation to a non-induced or stationary state; each state is illustrated relative to the non-induced or stationary state of microelectromechanical resonator of one exemplary embodiment of one aspect of the present inventions.
Figure 2A:
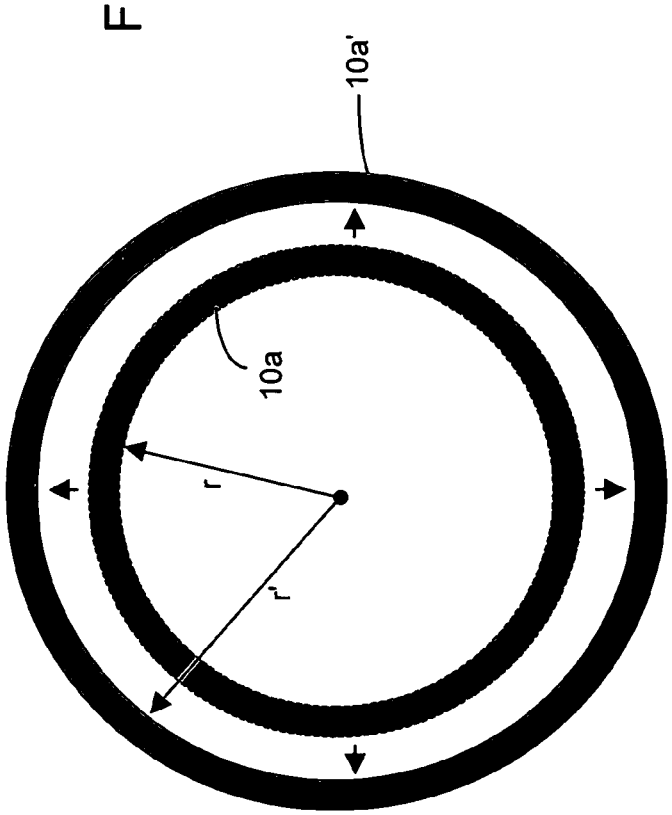

As mentioned above, when induced or in operation, MEMS ring resonator structure 10a oscillates or vibrates in an elongating (or breathing) motion or mode. With reference to FIG. 2A, when induced, MEMS ring resonator structure 10a expands to an elongated state, as indicated by MEMS ring resonator structure 10a', relative to the non-induced or stationary state. With reference to FIG. 2B, when induced, MEMS ring resonator structure 10a contracts to a compressed state, as indicated by MEMS ring resonator structure 10a", relative to the non-induced or stationary state. Notably, each state in FIGS. 2A and 2B is superimposed over (or illustrated relative to) the stationary state of MEMS ring resonator structure 10a. Moreover, illustration of the states may be exaggerated for the purposes of demonstrating the type of motion of MEMS ring resonator structure 10a.

Figure 3A:
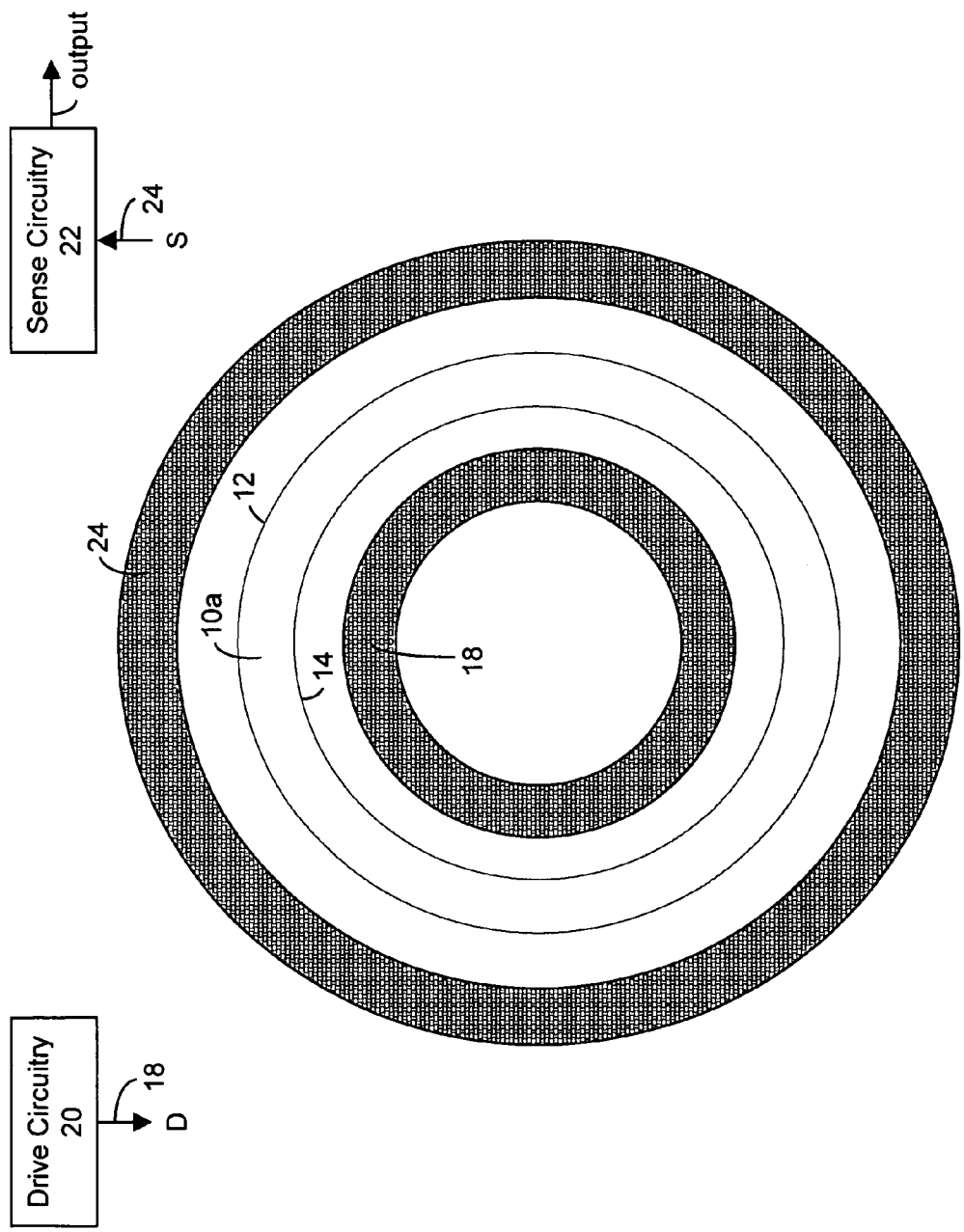
FIG. 3A illustrates a top view of an exemplary ring microelectromechanical resonator, in conjunction with drive and sense electrodes and drive and sense circuitry arranged in a single-ended signal sensing configuration, according to certain embodiments of the present inventions.

The MEMS ring resonator 10 may include sense and drive electrodes and circuitry that are configured to provide a single-ended output signal or differential output signals. With reference to FIG. 3A, in one exemplary embodiment of a single-ended output signal configuration, drive electrode 18 (which is electrically connected to drive circuitry 20) is juxtaposed to inner surface 14 of MEMS ring resonator structure 10a to induce the structure to oscillate or vibrate wherein the oscillation or vibration has one or more resonant frequencies. The sense circuitry 22, in conjunction with sense electrodes 24 which, in this embodiment, is juxtaposed to outer surface 12 of MEMS ring resonator structure 10a to sense, sample and/or detect a signal having the one or more resonant frequencies. In this regard, sense electrode 24 is disposed adjacent to outer surface 12 to provide a signal (for example, resulting from a change in capacitance between outer surface 12 and sense electrode 24 due to the oscillating motion of the resonator structure) which is representative of the oscillation or vibration to sense circuitry 22. The sense circuitry 22 receives the signal and, in response thereto, may output a signal, for example, a clock signal having a resonant frequency. Typically, the sense signal output is connected to the drive circuit to close the electronic oscillator loop. In this regard, the phase of the electronic drive signal should be appropriate to stimulate/drive the desired mode.

Figure 7A:
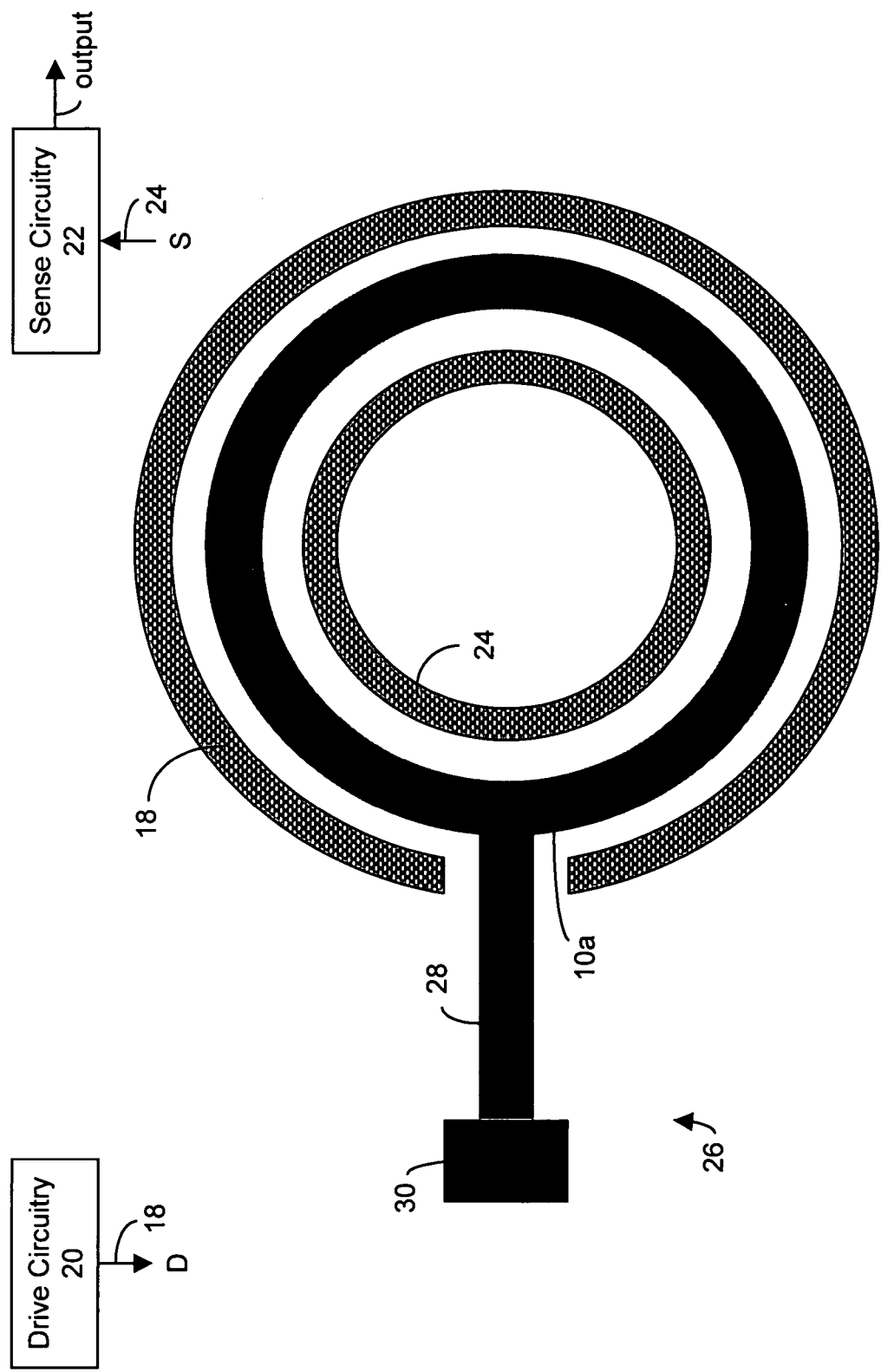
FIGS. 7A-7C illustrate top views of exemplary ring microelectromechanical resonators according to certain embodiments of the present inventions, in conjunction with drive and sense electrodes and certain anchoring techniques and/or configurations that employ an impedance matching structure resonant in bulk-longitudinal mode, according to certain embodiments of the present inventions.
Figure 7B:
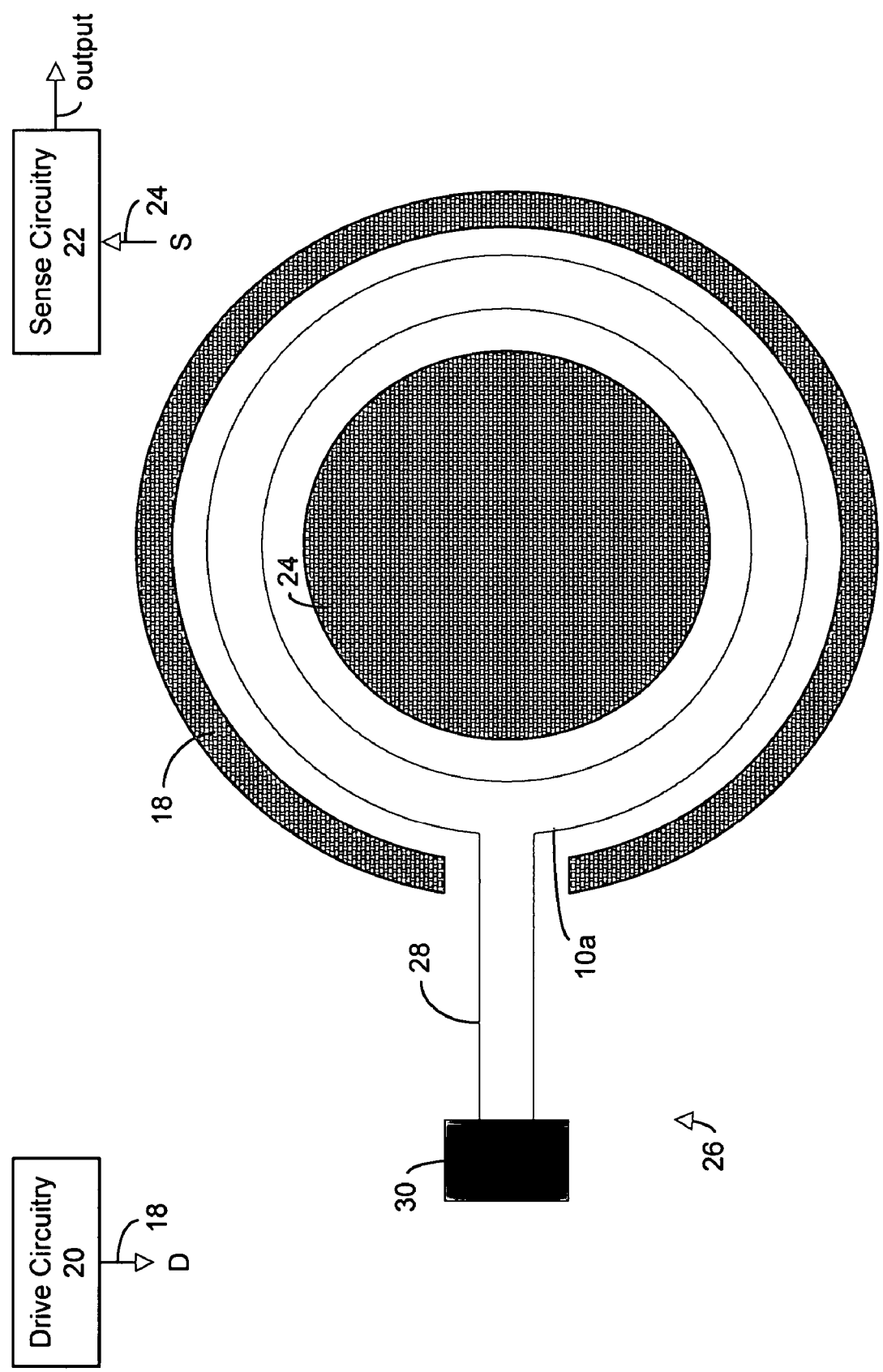
Figure 8A:
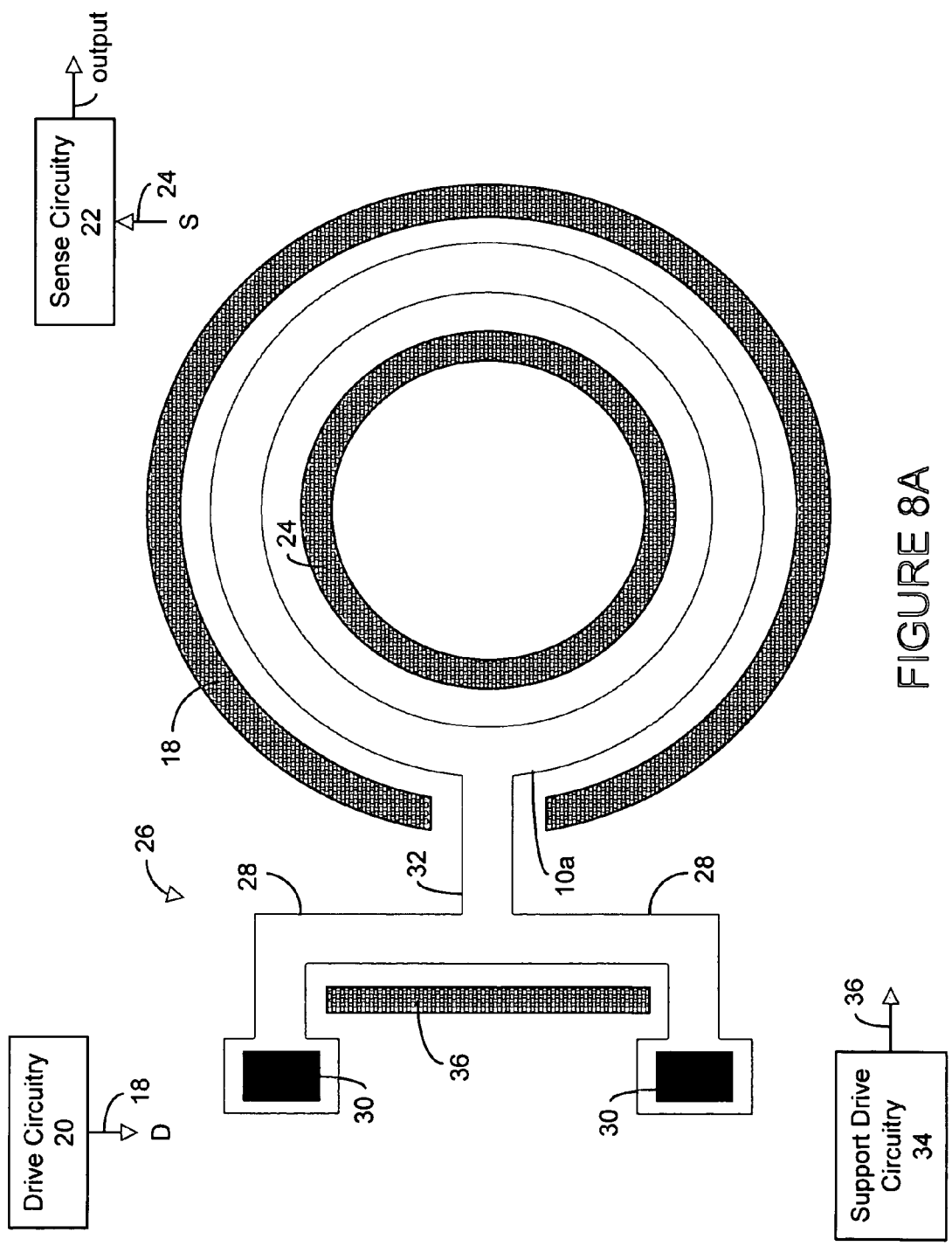
Figure 8B:
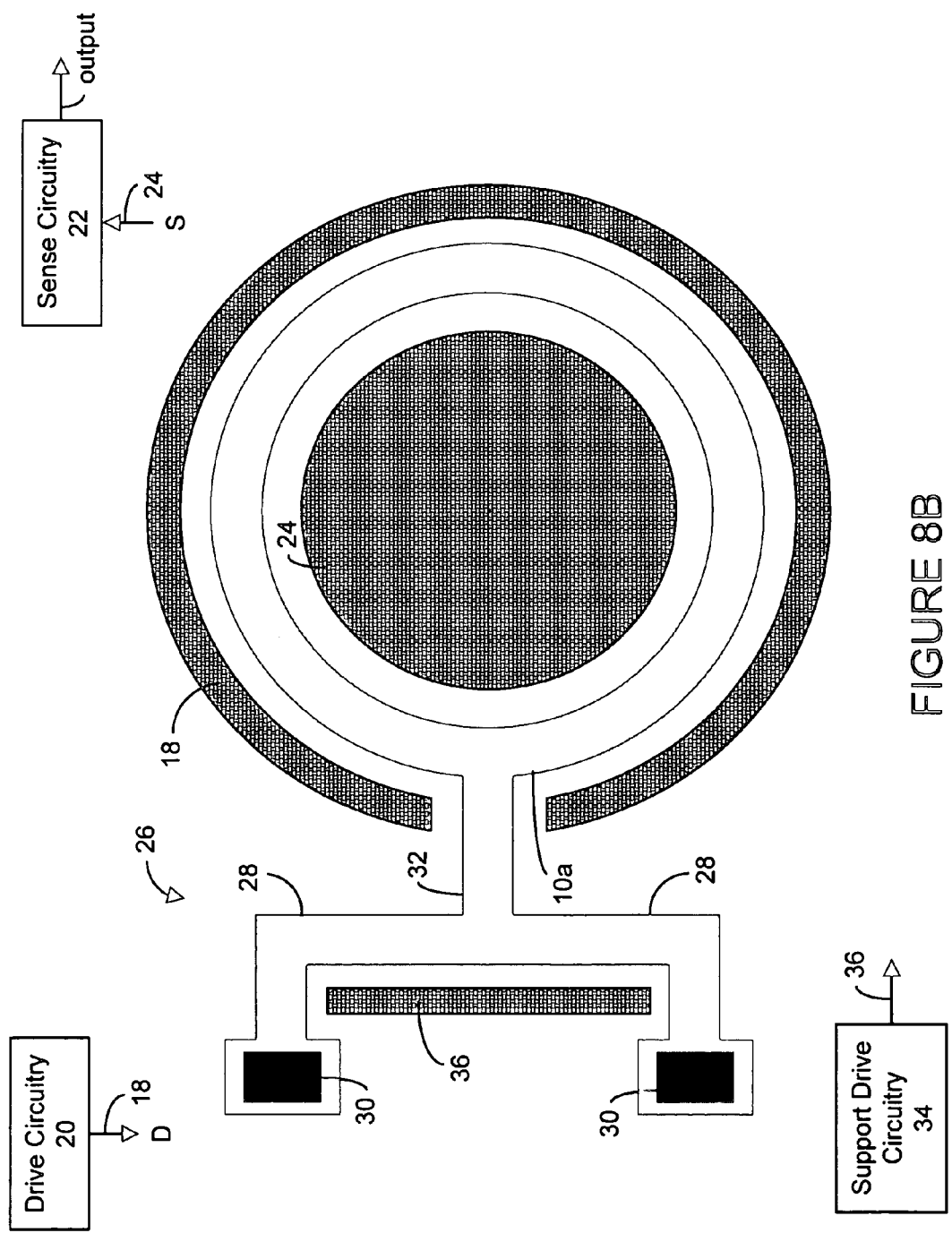

Notably, while in the exemplary embodiment illustrated in FIG. 3A, drive electrode 18 is disposed on the inside of the resonator structure, and sense electrode 24 is disposed on the outside of the resonator structure 10a. In another embodiment, drive electrode 18 is disposed on outside of the resonator structure 10a (i.e., disposed adjacent to outer surface 12 of MEMS ring resonator structure 10a), and sense electrode 24 is disposed on the inside of the resonator structure 10a (i.e., disposed adjacent to inner surface 14 of MEMS ring resonator structure 10a). (See, for example, FIGS. 7A, 7B and 8A).

The drive circuitry 20 and sense circuitry 22, as well as drive electrode 18 and sense electrode 24, may be conventional well-known drive and sense circuitry and electrodes. Indeed, drive circuitry 20 and sense circuitry 22 may be any MEMS sense and drive circuitry whether now known or later developed.

In addition, drive electrode 18 and sense electrode 24 may be disposed or positioned relative to outer surface(s) and inner surface(s) of MEMS ring resonator structure 10a in order to detect one or more selected or predetermined harmonics of MEMS ring resonator structure 10a. The number and length of drive electrode 18 and sense electrode 24 may be selected in order to optimize, enhance and/or improve the operation of the MEMS resonator. Indeed, drive electrode 18 and sense electrode 24 may be of any type and/or shape whether now known or later developed.

Notably, drive circuitry 20 and sense circuitry 22 may be integrated on the same substrate in which the MEMS ring resonator structure resides (or is fabricated in). In addition, or in lieu thereof, drive circuitry 20 and sense circuitry 22 may be integrated on a substrate that is physically separate from (and electrically interconnected with) the substrate in which the MEMS ring resonator structure resides.

As mentioned above, the present invention may employ a differential signaling configuration. For example, with reference to FIG. 3B, in one exemplary embodiment of a differential output signal configuration, drive electrodes 18a and 18b (which are electrically connected to drive circuitry 20) are juxtaposed to MEMS ring resonator structure 10a to induce oscillation or vibration. In this regard, MEMS ring resonator structure 10a vibrates or resonates, in-plane, to generate output signals that are (or are substantially) 180 degrees out of phase. The sense electrodes 24a and 24b are disposed adjacent to MEMS ring resonator structure 10a to provide a signal (for example, resulting from a change in capacitance between the ring resonator structure and sense electrodes 24 due to the oscillating motion of the structure) which is representative of the oscillation or vibration to sense circuitry 22 which senses, samples and/or detects a signal having the one or more resonant frequencies. The sense circuitry 22 receives the signal and, in response thereto, may output a differential signal pair, for example, a differential clock signal having a resonant frequency.

The drive circuitry 20 and sense circuitry 22 may be conventional well-known circuitry. Indeed, drive circuitry 20 and sense circuitry 22 may be any type of circuitry (whether or not integrated (or fabricated) on the same substrate in which the MEMS resonator structure resides), and all such circuitry, whether now known or later developed, are intended to fall within the scope of the present invention.

Figure 3B:
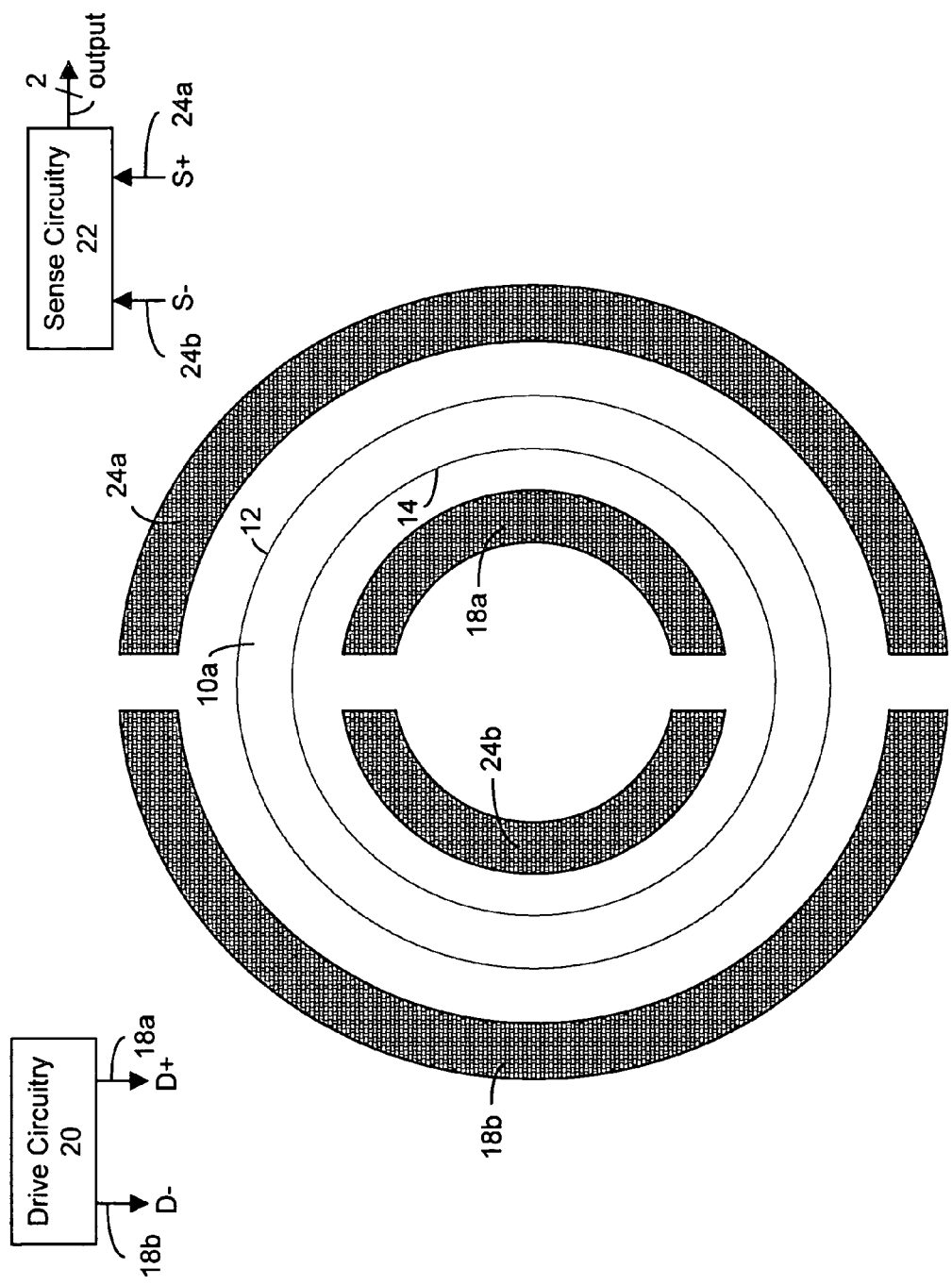
FIG. 3B illustrates a top view of an exemplary ring microelectromechanical resonator, in conjunction with drive and sense electrodes and drive and sense circuitry arranged in a differential signal sensing configuration, according to certain embodiments of the present inventions.
Figure 7C:
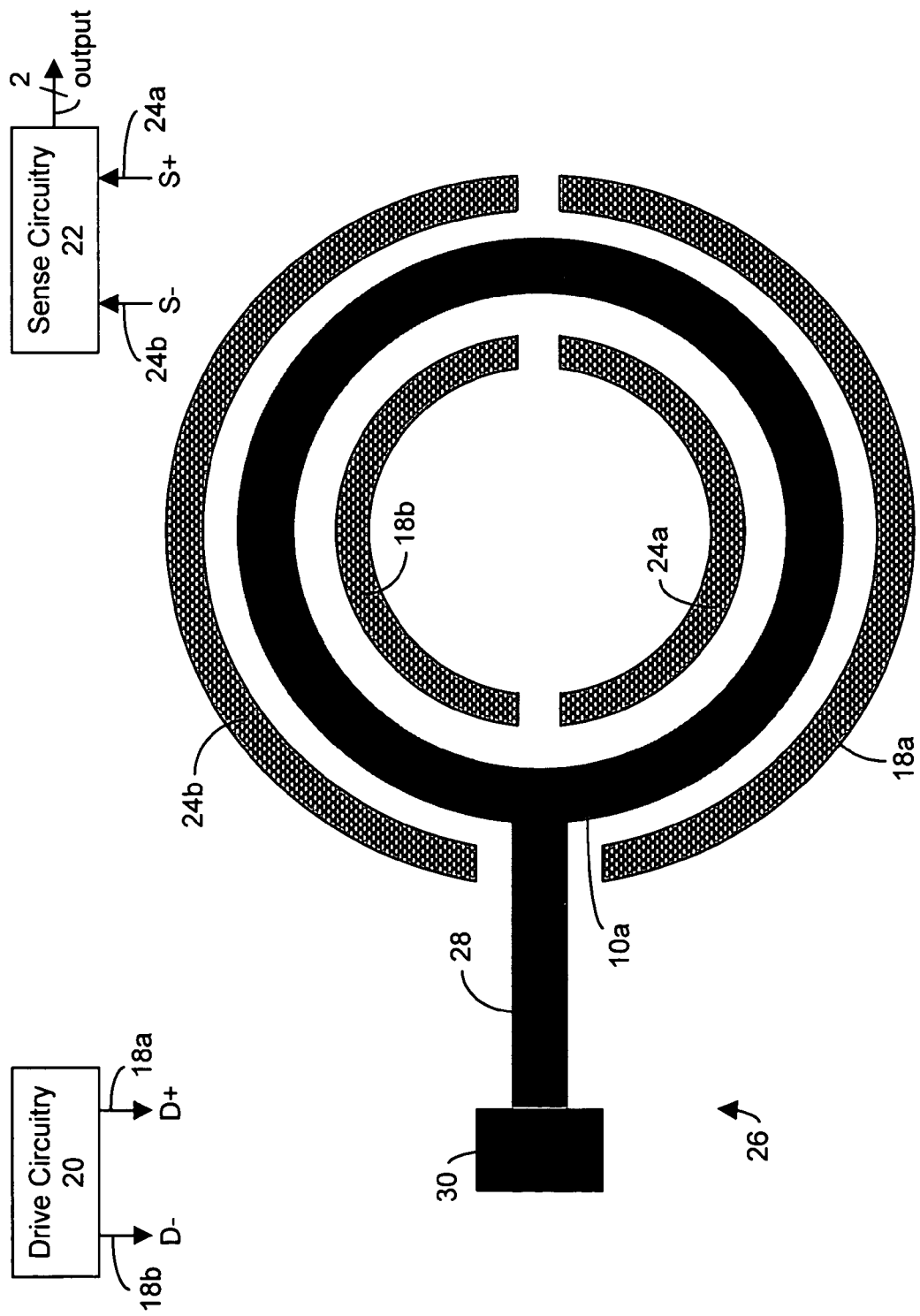

While in the exemplary embodiment illustrated in FIG. 3B, drive electrode 18a and sense electrode 24b are juxtaposed to the inside of MEMS ring resonator structure 10a, and drive electrode 18b and sense electrode 24a are juxtaposed to the outside of the resonator structure, in another exemplary embodiment, drive electrode 18a and sense electrode 24b are juxtaposed to the outside of the resonator structure (i.e., disposed adjacent to outer surface 12 of MEMS ring resonator 10), and drive electrode 18b and sense electrode 24a are juxtaposed to the inside of the resonator structure (i.e., disposed adjacent to inner surface 14 of MEMS ring resonator 10). (See, for example, FIGS. 7C and 8C).

In addition, drive electrodes 18 and sense electrodes 24 may be disposed or positioned relative to ring resonator structure in order to detect one or more selected or predetermined harmonics of structure. Moreover, the number and length of drive electrodes 18 and sense electrodes 24 may be selected in order to optimize, enhance and/or improve the operation of the MEMS resonator.

Notably, as mentioned above, drive circuitry 20 and sense circuitry 22 may be integrated on the same substrate in which the MEMS ring resonator structure resides (or is fabricated in). In addition, or in lieu thereof, drive circuitry 20 and sense circuitry 22 may be integrated on a substrate that is physically separate from (and electrically interconnected with) the substrate in which the MEMS resonator structure resides.

Figure 4A:
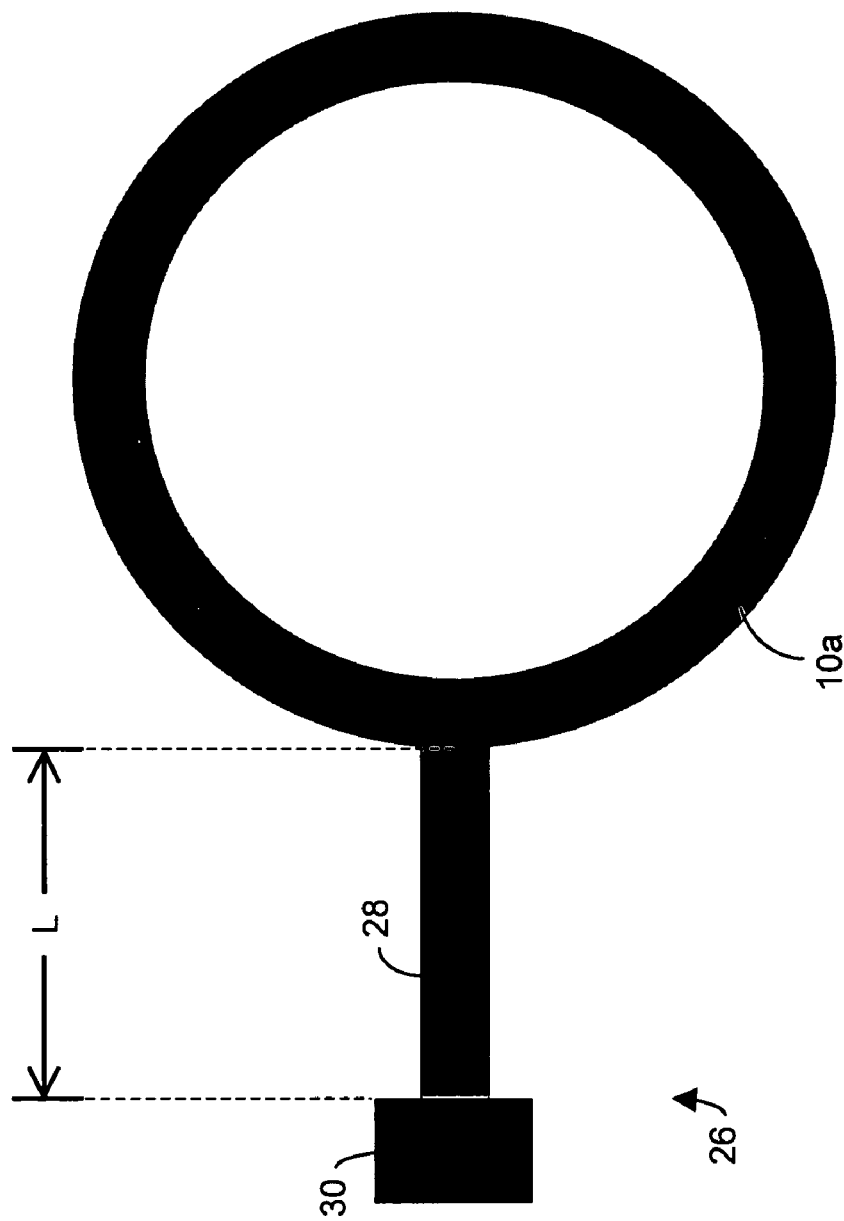
FIGS. 4A and 4B illustrate top views of an exemplary ring microelectromechanical resonator according to certain embodiments of the present inventions wherein the ring microelectromechanical resonator is anchored to the substrate using anchoring techniques and/or configurations that employ an impedance matching structure resonant in bulk-longitudinal mode.
Figure 4B:
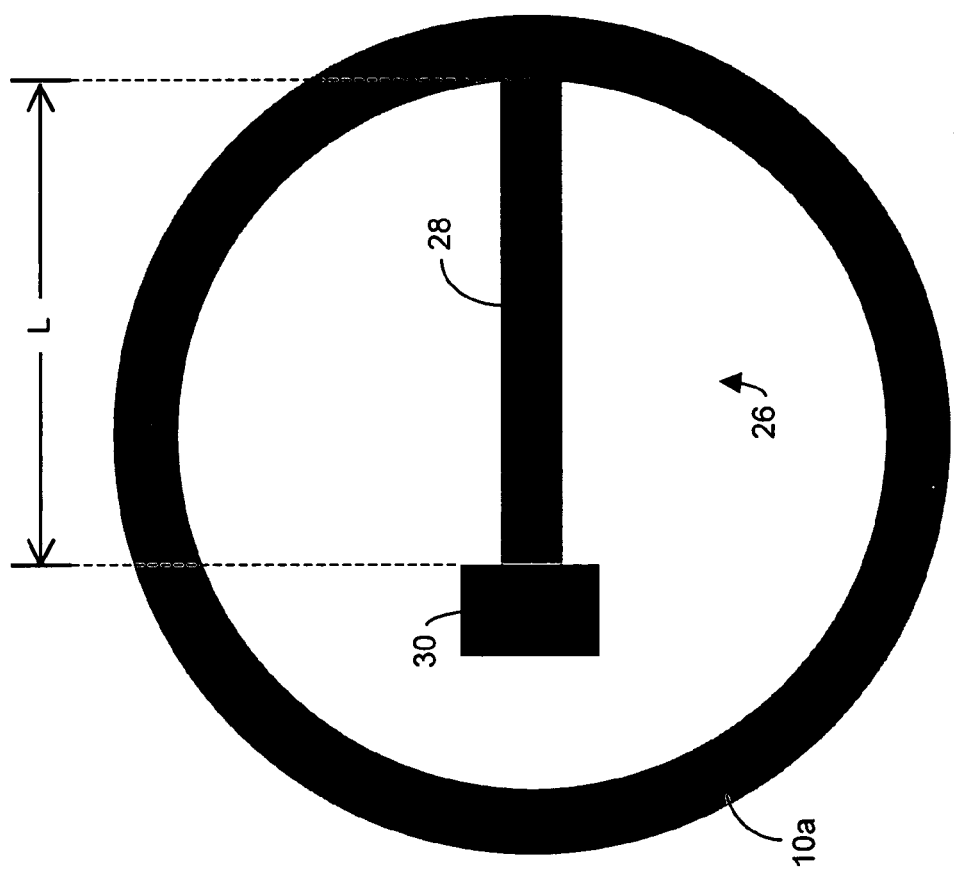

The MEMS ring resonator 10 may be anchored to substrate 16 using a variety of configurations, structures and/or architectures. For example, with reference to FIGS. 4A and 4B, in one embodiment, MEMS ring resonator 10 includes one or more anchor support structures 26 to secure, fix and/or connect MEMS ring resonator structure 10a to substrate 16. In this embodiment, anchor support element 26 includes impedance matching structure 28 and substrate anchor 30. The impedance matching structure 28 may be a beam, having a predetermined length, which connects MEMS ring resonator structure 10a to substrate anchor 30.

The impedance matching structure 28 may manage, control, reduce, eliminate and/or minimize loading on MEMS ring resonator structure 10a. The impedance matching structure 28 of this embodiment operates in bulk-longitudinal mode. In this way, when induced, all portions of MEMS ring resonator structure 10a includes a uniform and consistent and/or a substantially uniform and consistent elongating or breathing motion. Thus, in operation, anchor support element 26 "matches" (or substantially "matches") the elongation/compression motion and/or frequency of MEMS ring resonator structure 10a, thereby allowing the resonator structure to oscillate or vibrate in its "natural" mode-shape and frequency.

Figure 5:
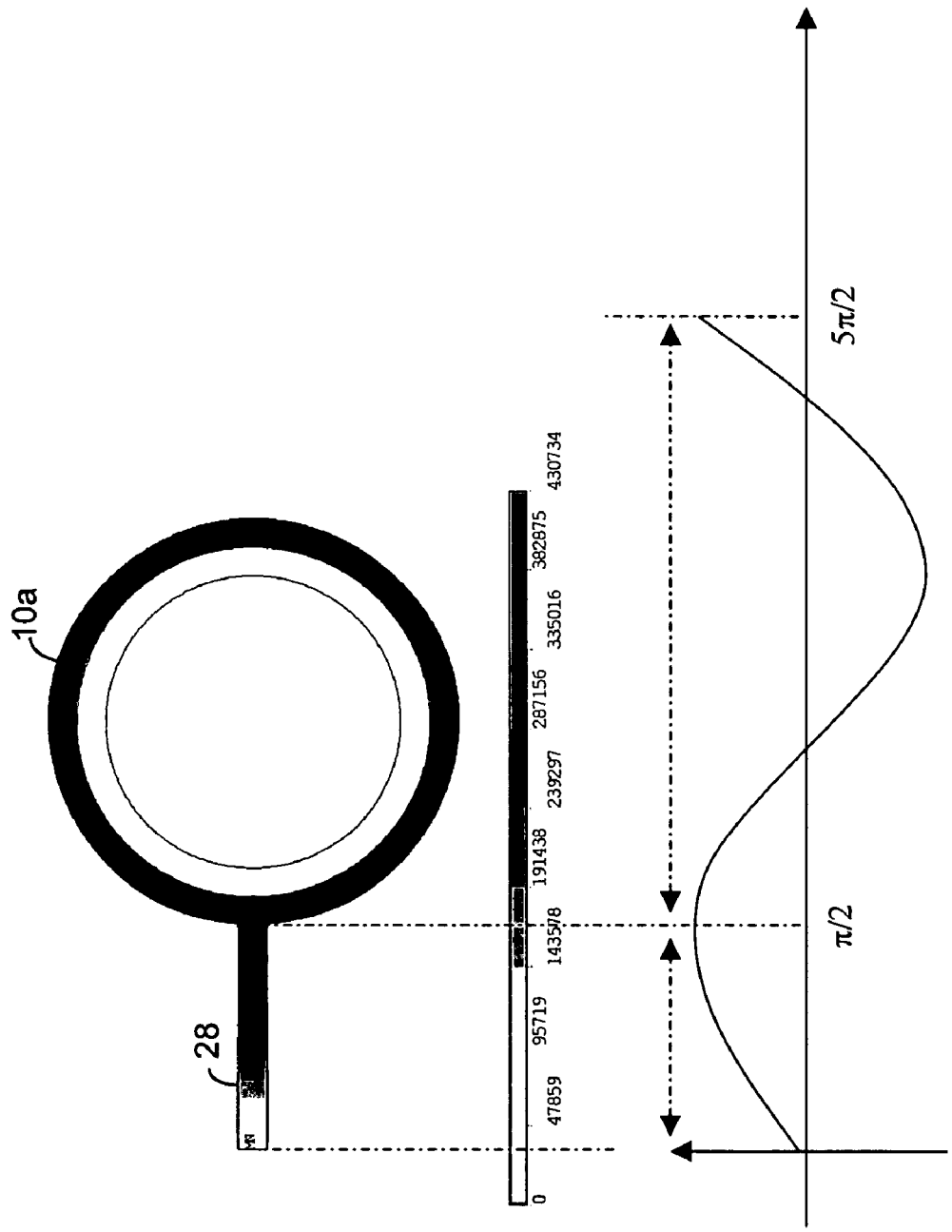
FIG. 5 is a finite element analysis simulation and corresponding wavelength analysis of an exemplary ring microelectromechanical resonator, as illustrated in FIG. 4A, employing a quarter wavelength impedance matching structure (which is described below)
Figure 6A:
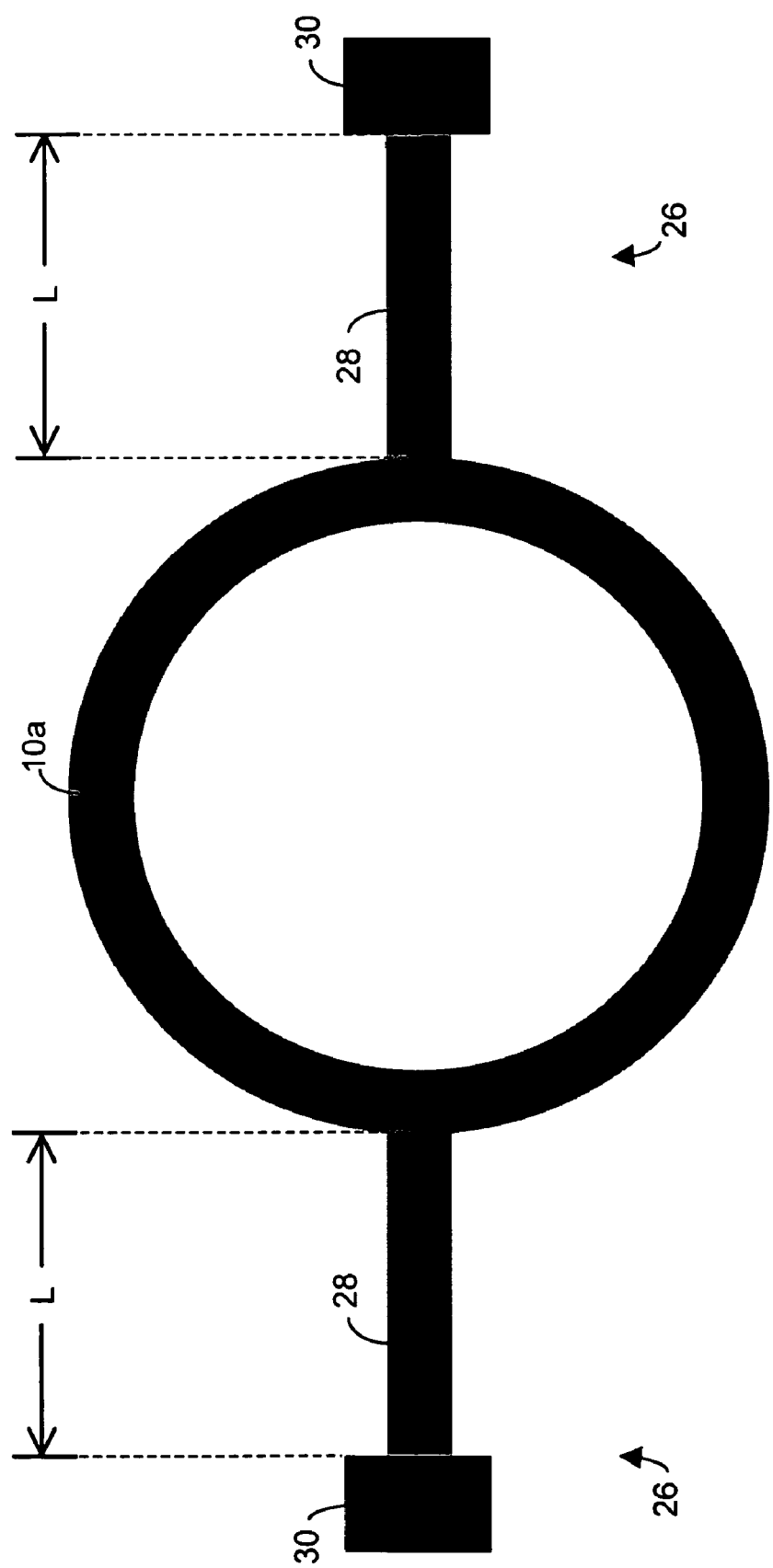
Figure 6B:
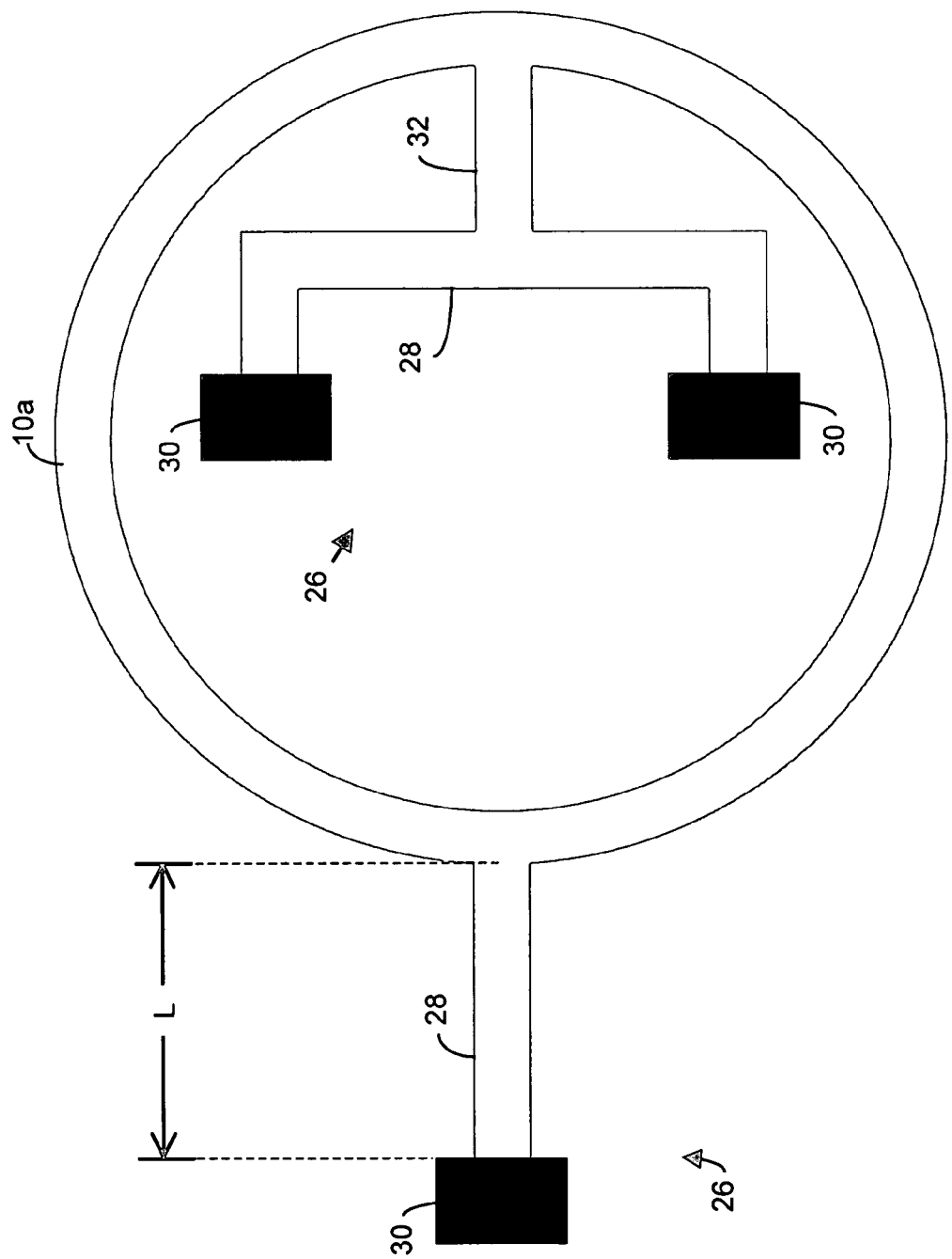
Figure 6C:
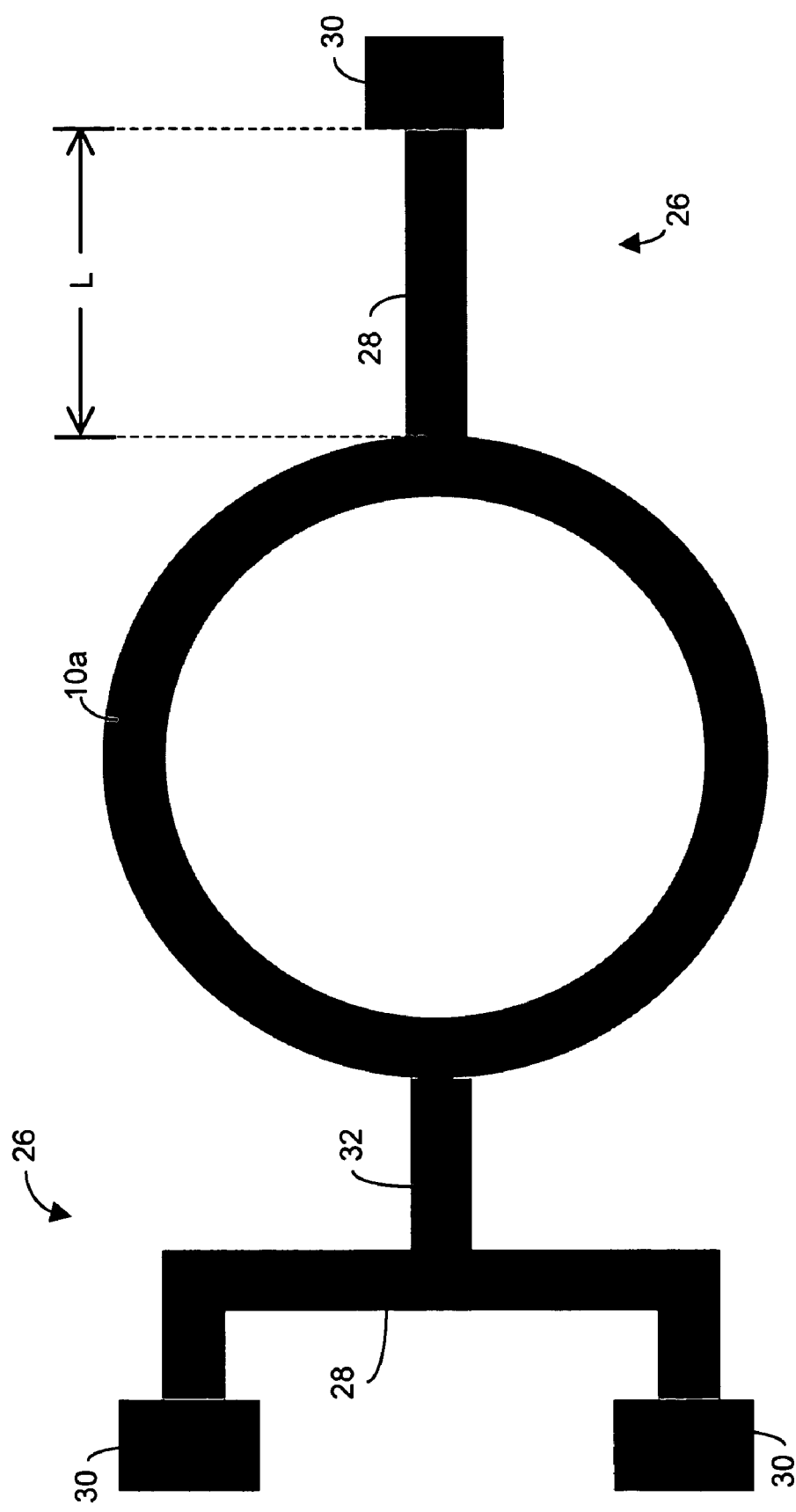
Figure 6D:
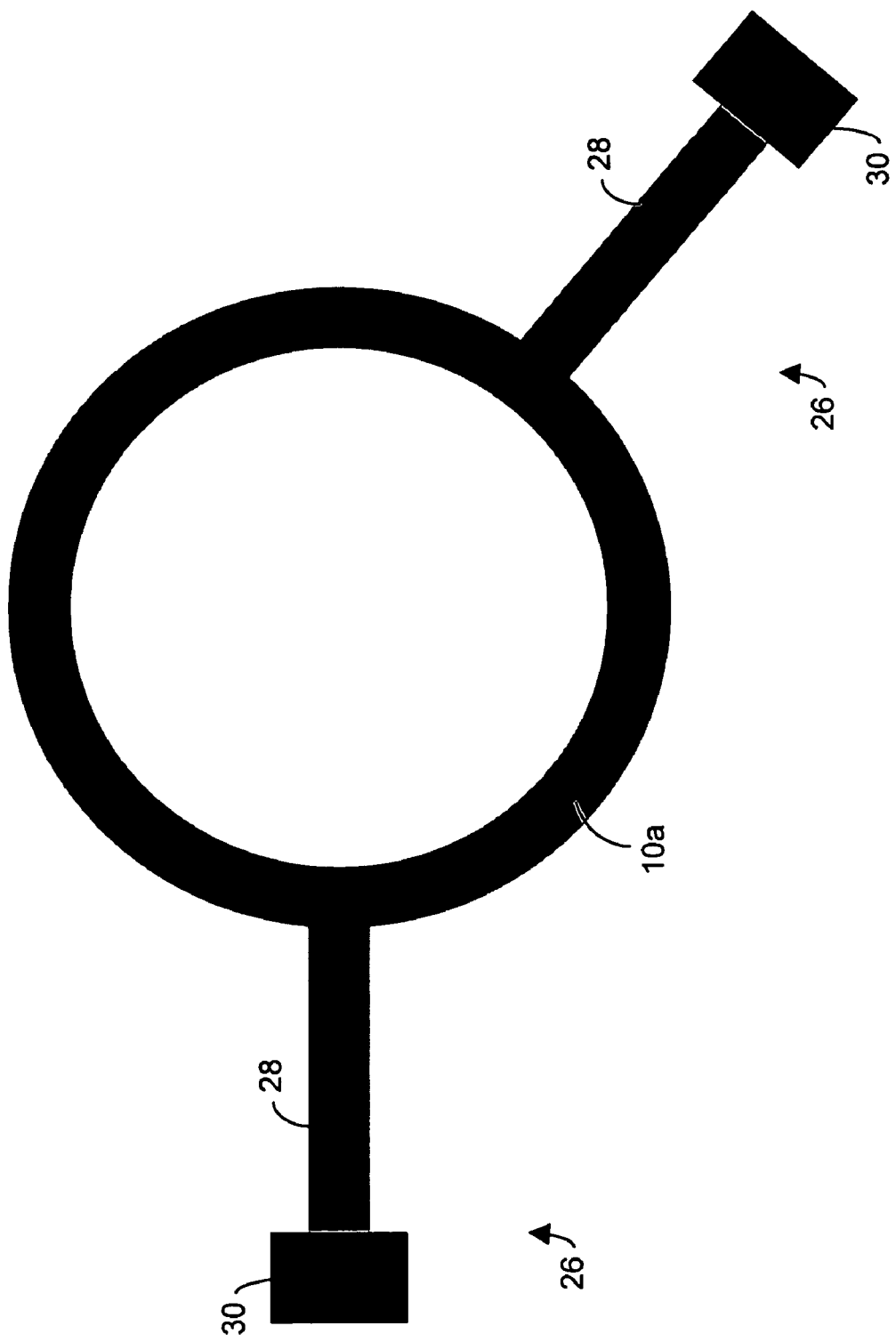
Figure 6E:
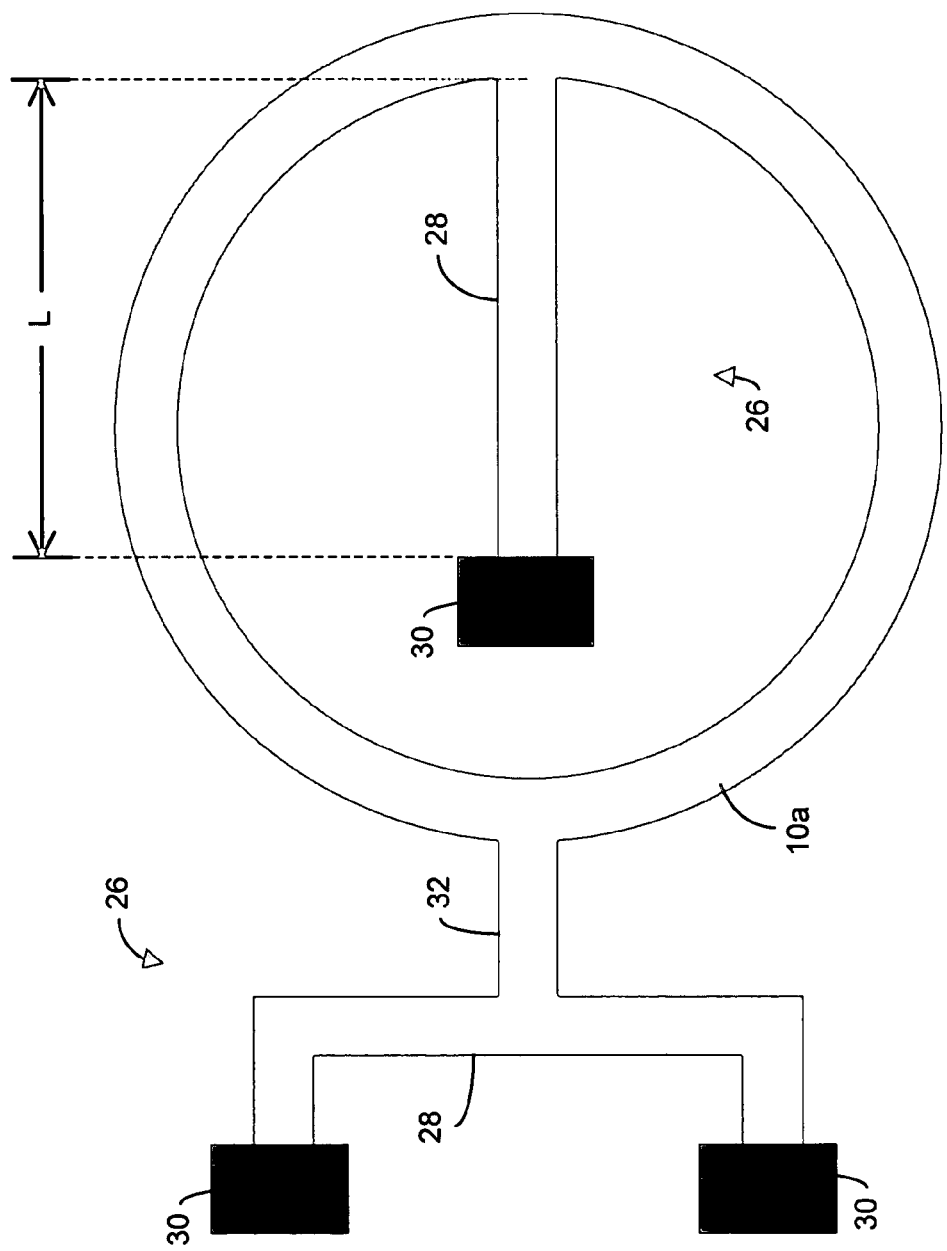
Figure 6F:
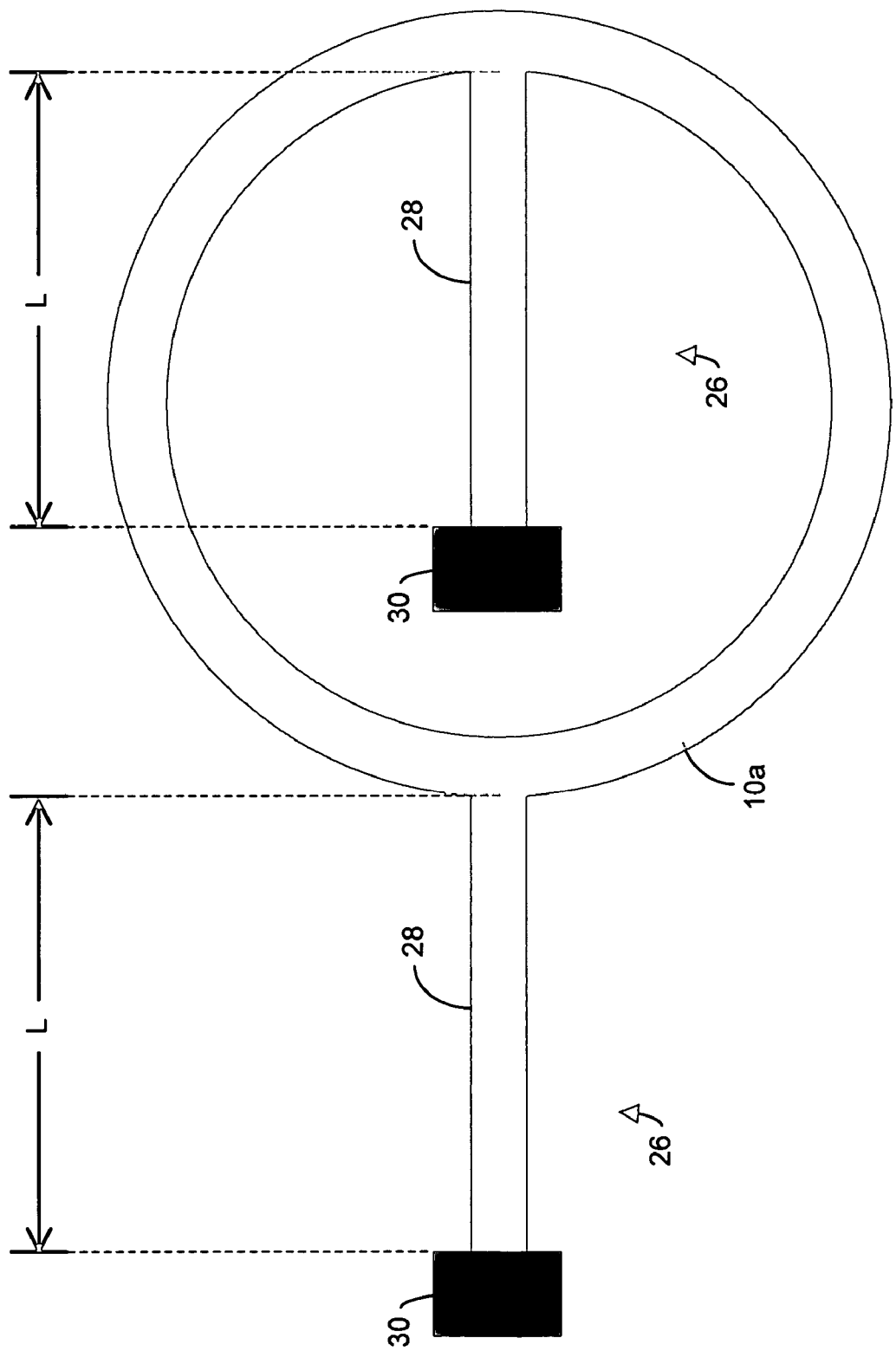
Figure 6G:
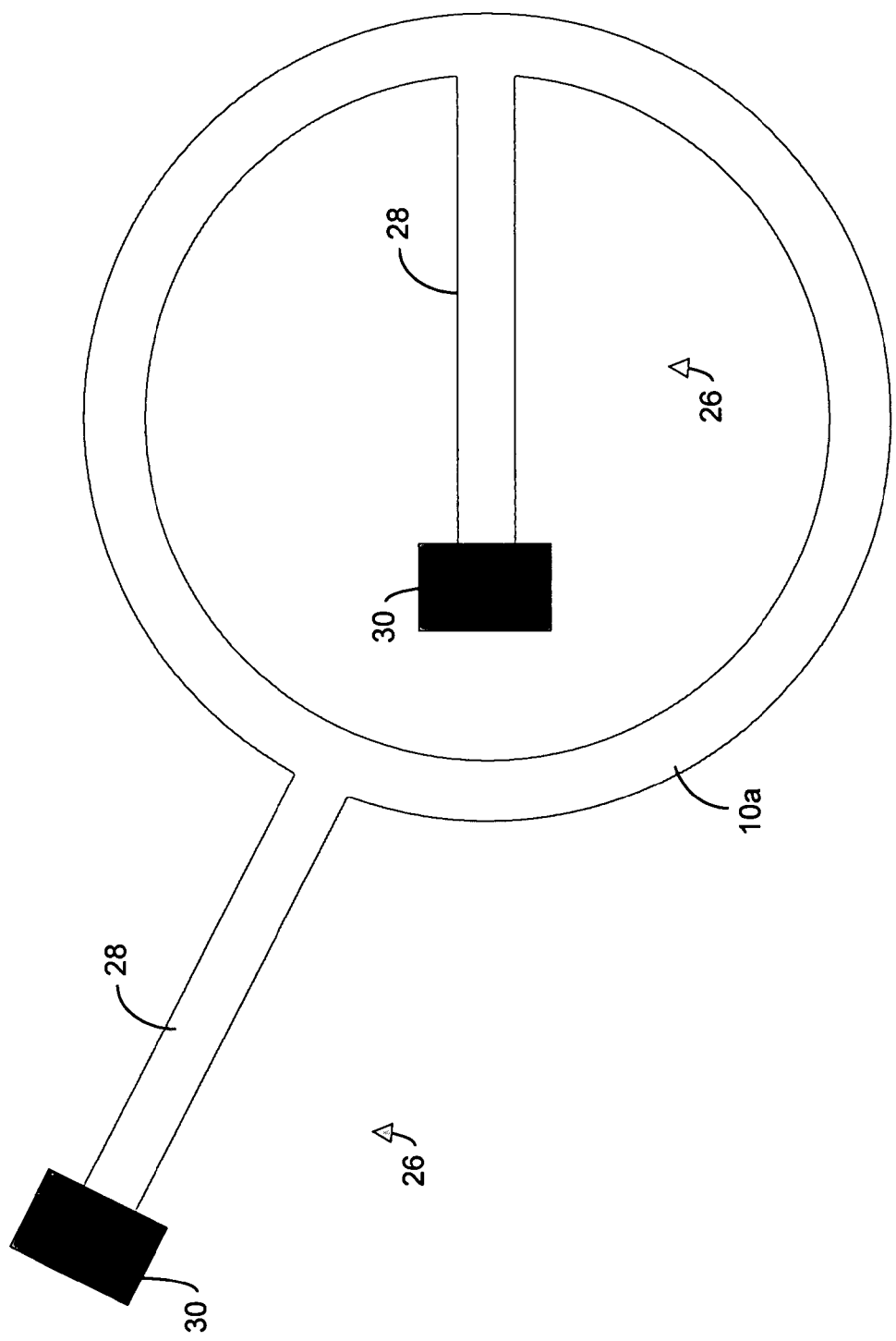
Figure 6H:
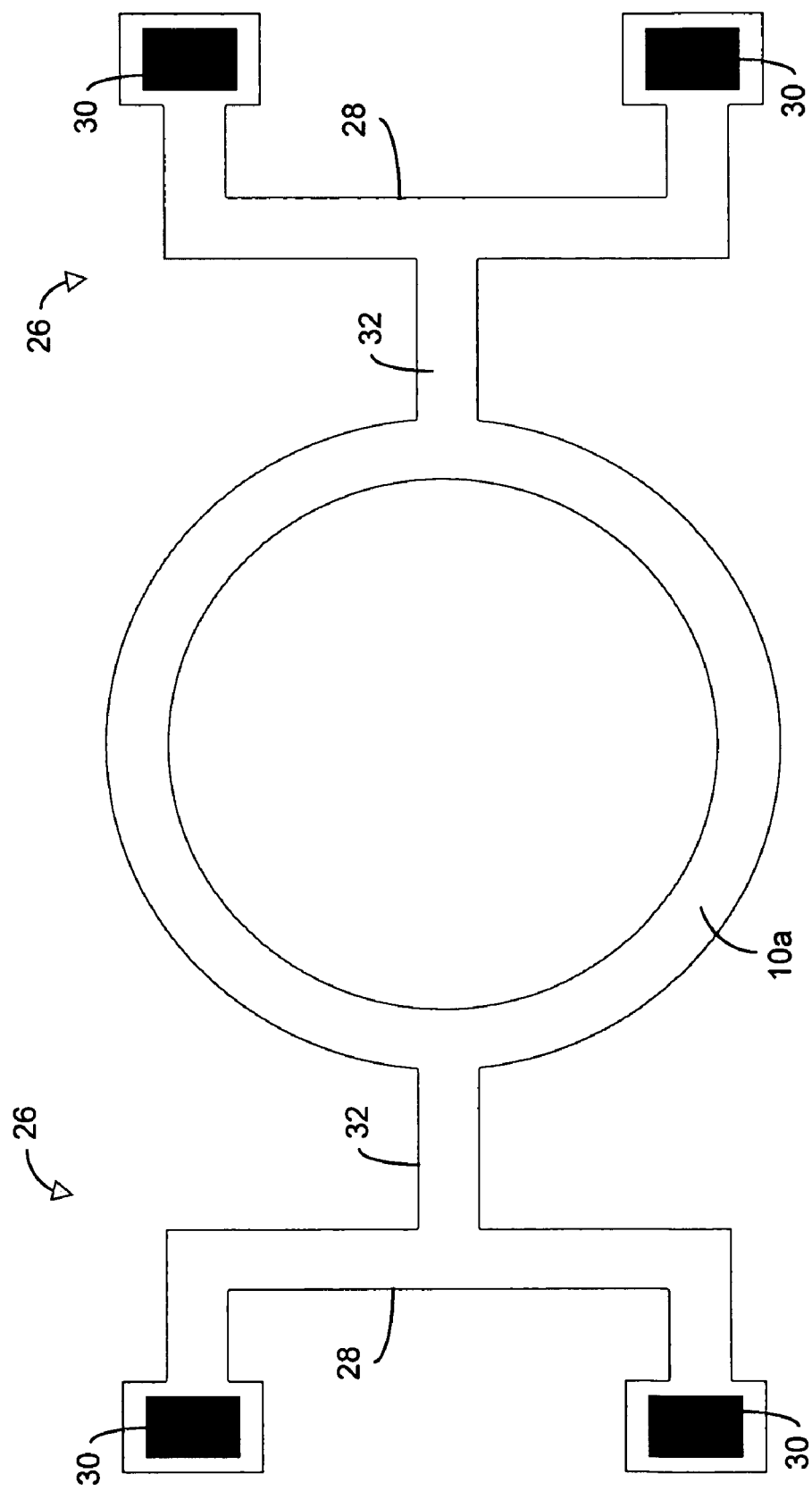
Figure 61:
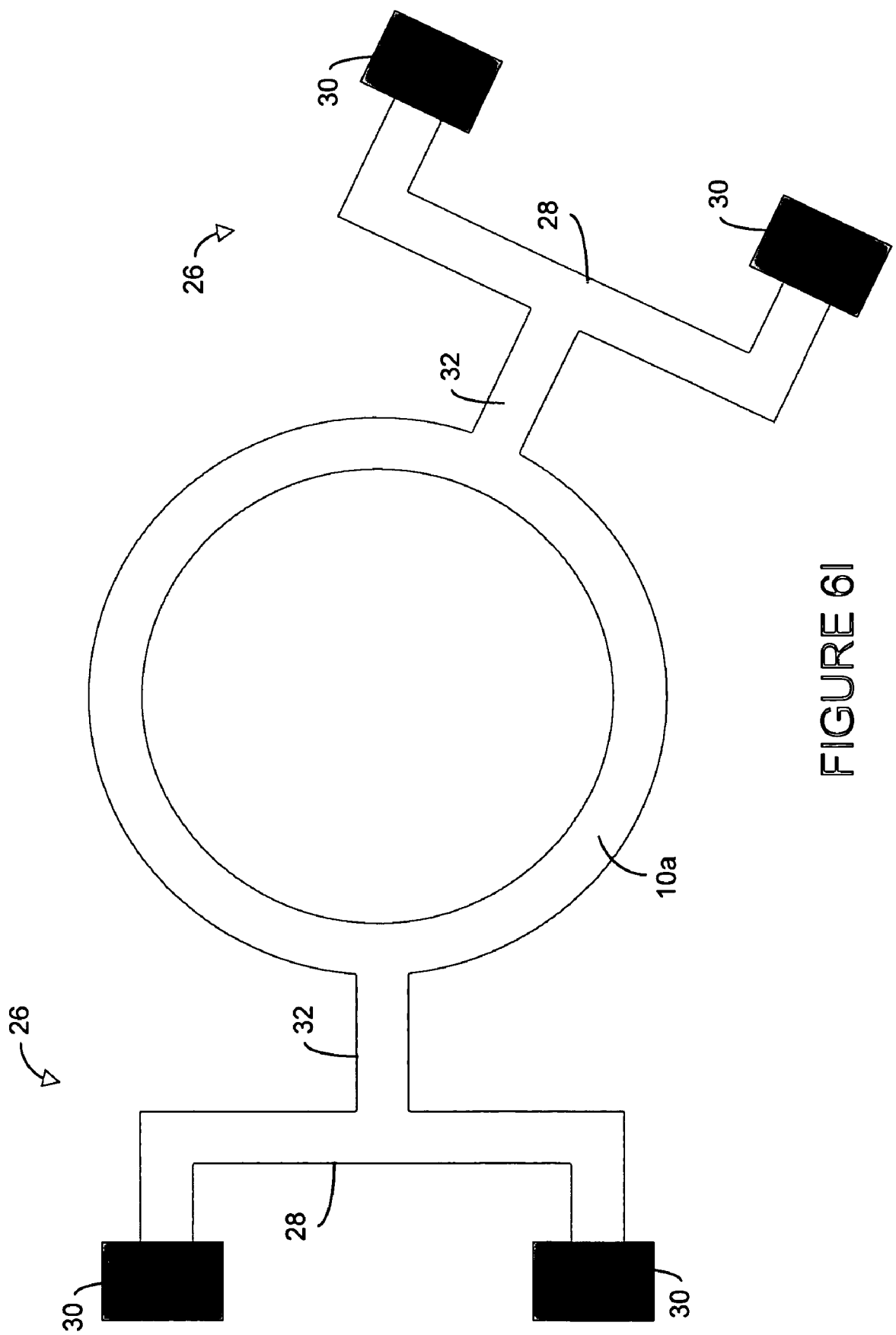
Figure 6J:
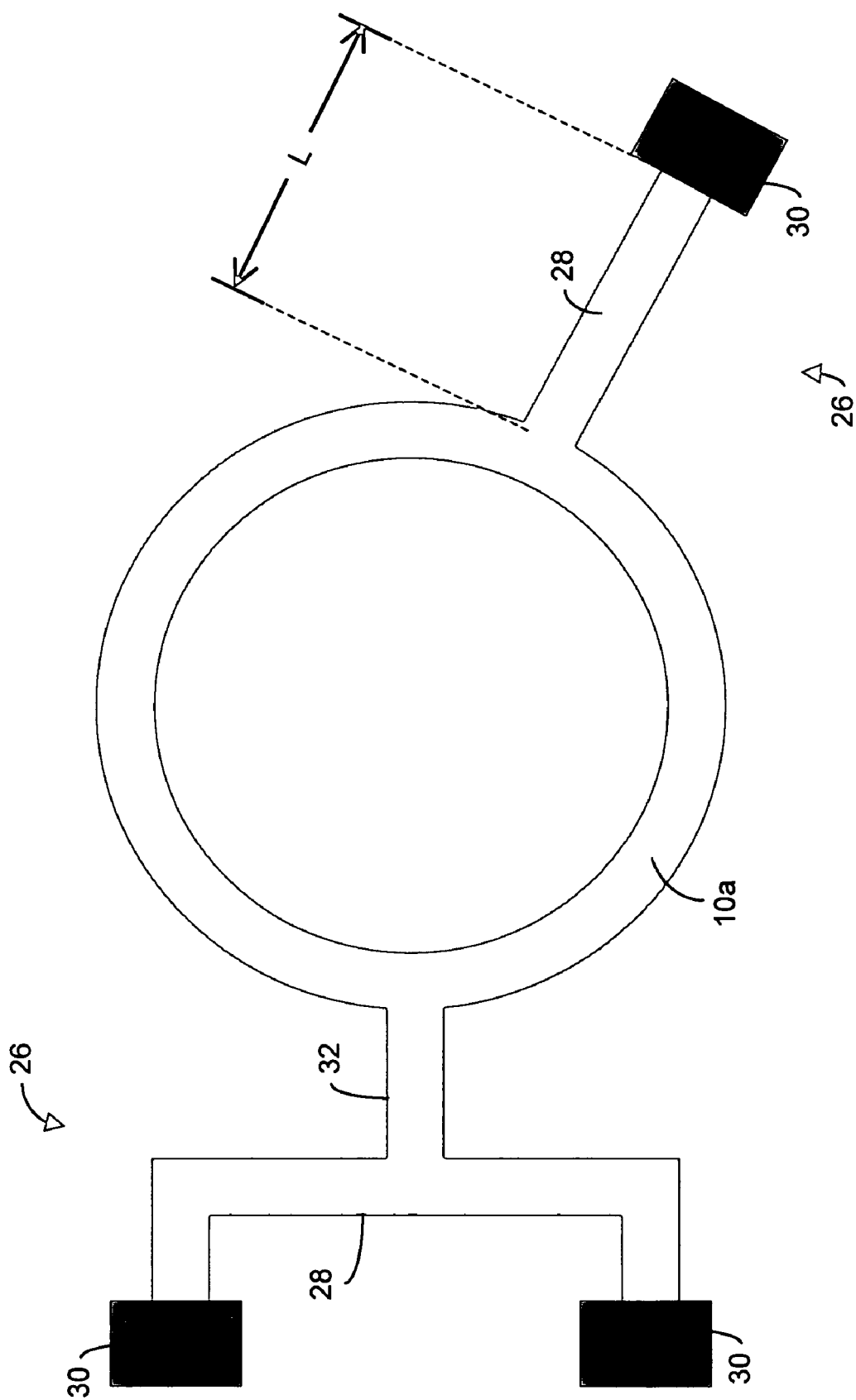
Figure 6K:
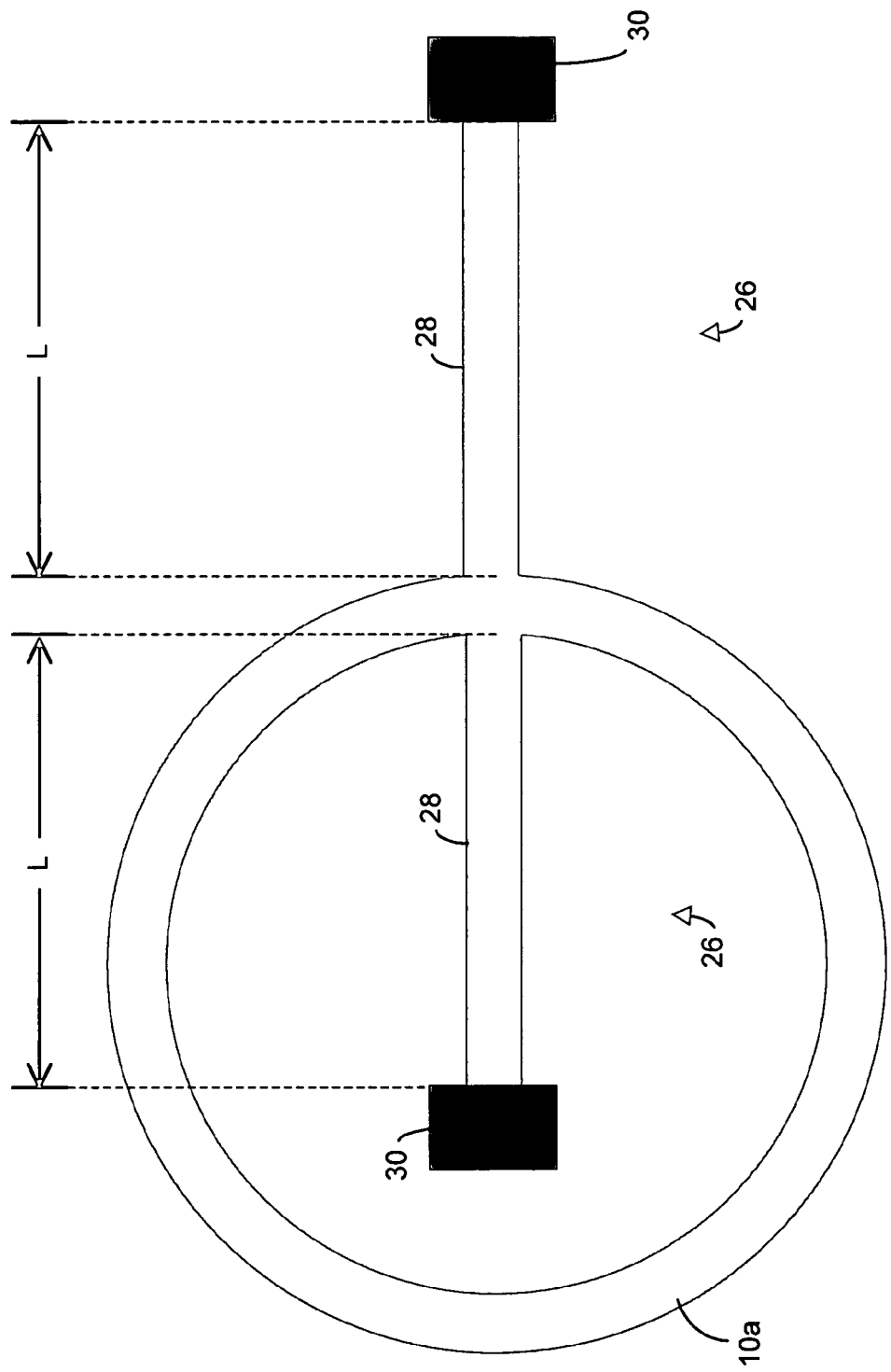

In one embodiment, the length of impedance matching structure 28 may be characterized as follows:

$$L = \frac{\lambda}{4} = \frac{L_{ring\ resonator\ structure}}{4} = \frac{\cdot \pi}{2} \cdot (R_i + w) \qquad \text{EQUATION 2}$$

where:
$\lambda$=wavelength
$L_{ring\ resonator\ structure}$=length of the ring resonator structure=$2\pi R_c$
w=width of the ring resonator structure
$R_i$=inner radius of curvature of the ring resonator structure Thus, in one embodiment, the length of impedance matching structure 28 may be a multiple of a one-quarter wavelength matching beam. (See, for example, FIG. 5).

Figure 4C:
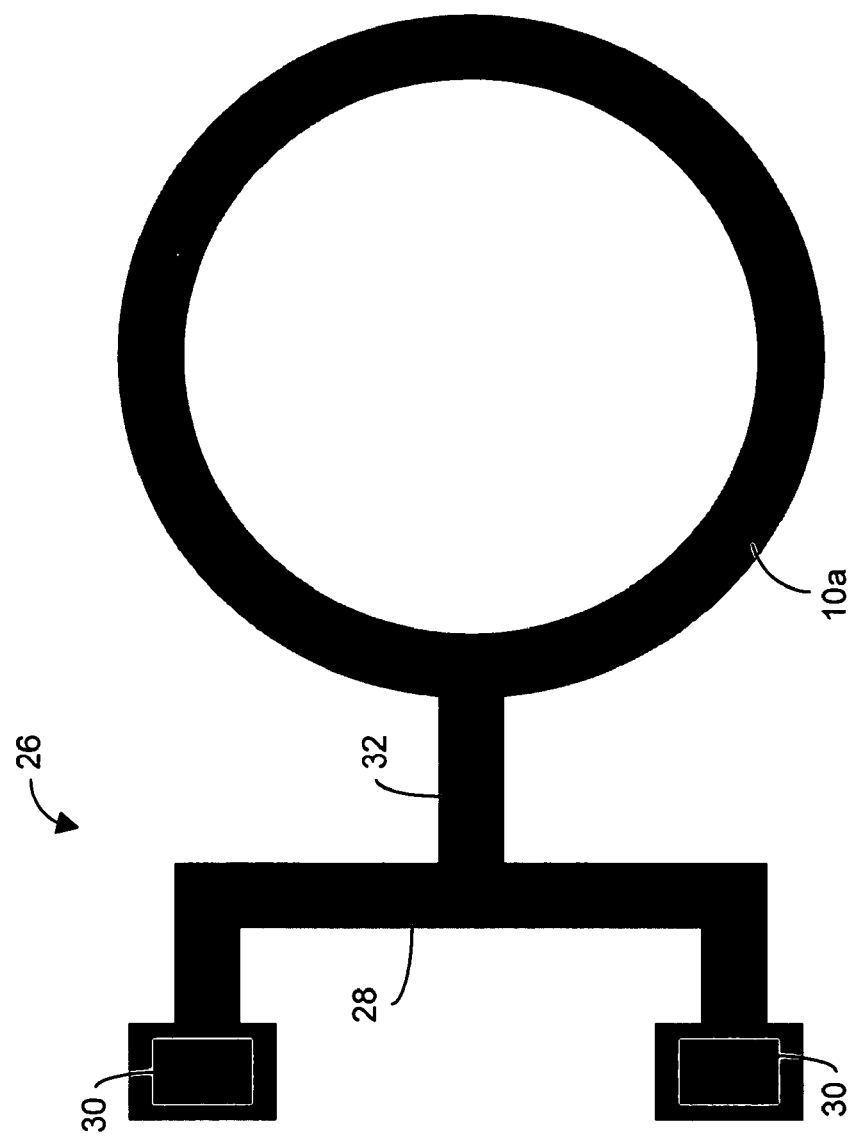

With reference to FIGS. 4C and 4D, in another embodiment, MEMS ring resonator 10 includes anchor support structures 26 having impedance matching structure 28 that is coupled to MEMS ring resonator structure 10a via coupling beam 32. The substrate anchor 30 secures, fixes and/or connects MEMS ring resonator structure 10a to substrate 16. The length of impedance matching structure 28 may be a multiple of a one-quarter wavelength matching beam.

In this embodiment, impedance matching structure 28 is a beam that resonates in a flexure mode and includes a frequency of oscillation, and deflection thereof, that "matches" (or substantially "matches") the motion and/or frequency of MEMS ring resonator structure 10a. The coupling beam 32 provides a fixed connection between impedance matching structure 28 and the ring resonator structure. As such, MEMS ring resonator structure 10a may oscillate or vibrate in its "natural" mode-shape and frequency while secured or fixed to substrate 16.

Thus, in this embodiment, impedance matching structure 28 flexes in-phase with the motion of the ring resonator structure. As such, when MEMS ring resonator structure 10a is induced to move in a first direction, impedance matching structure 28 flexes in the same direction by an amount that is the same or substantially the same as structure 10a. For example, when MEMS ring resonator structure 10a expands, impedance matching structure 28 is induced to flex in the same direction with an amplitude that is the same or substantially the same as the expansion of structure 10a. Similarly, when MEMS ring resonator 10a contracts, impedance matching structure 28 is induced to flex in the same direction and include an amplitude that is the same or substantially the same as the contraction of the ring resonator structure. In this way, impedance matching structure 28 effectively de-couples MEMS ring resonator structure 10a from substrate 16 to facilitate, among other things, substantially uniform and consistent elongating/compressing or breathing motion throughout MEMS ring resonator structure 10a without experiencing loading effects from or due to substrate anchor 30.

The substrate anchor 32 physically secures and/or connects MEMS ring resonator structure 10a to substrate 16. The substrate anchor 32 may employ any structure and/or technique whether now known or later developed. Indeed, all structures and/or techniques are intended to fall within the scope of the present invention. For example, the present invention may employ the anchoring techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems patent Application"). It is expressly noted that the entire contents of the Anchors for Microelectromechanical Systems patent Application, including, for example, the features, attributes, alternatives, materials, techniques and advantages of all of the embodiments and/or inventions, are incorporated by reference herein.

Thus, the anchoring architecture of MEMS ring resonator 10 may be relatively stress-free and/or strain-free (from the perspective of ring resonator structure) which may facilitate more uniform and consistent elongating/compressing or breathing motion through the entire MEMS ring resonator structure 10a as well as significantly decrease, reduce, minimize and/or eliminate any anchor energy loss and thereby increase, enhance, maximize the Q (and output signal) of MEMS ring resonator 10. In addition, anchor support element(s) 26 suspend the ring resonator structure above substrate 16.

Notably, in the event that more than one anchor support elements 26 is employed, such anchor support elements 26 may be disposed symmetrically, asymmetrically, equal distant or unequal distant around the circumference of outer surface 12 and/or inner surface 14 of MEMS ring resonator structure 10a. (See, for example, FIGS. 6A-6K). In these embodiments, it may be advantageous, however, to dispose the anchors equal distant around the circumference of outer surface 12 and/or inner surface 14 of MEMS ring resonator structure 10a in order to more evenly and symmetrically load structure 10a, for example, in the event that anchor support elements 26 do not sufficiently, completely or substantially completely de-couple MEMS ring resonator structure 10a from substrate 16.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

The MEMS ring resonator of the present inventions may employ any sense and drive configuration/technique whether now known or later developed. (See, for example, FIGS. 7A-7C and 8A-8C). The drive and sense circuitry (whether single-ended or differential) may be integrated on the same substrate in which the MEMS resonator structure resides (or is fabricated in). In addition, or in lieu thereof, drive and sense circuitry may be integrated on a substrate that is physically separate from (and electrically interconnected with) the substrate in which the MEMS resonator structure resides. Moreover, the drive and sense electrode may be of a conventional type or may be any type and/or shape whether now known or later developed.

The drive electrodes and sense electrodes may be of a conventional, well known type or may be any type and/or shaped electrode whether now known or later developed. Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

Notably, the dimensions, characteristics and/or parameters of a MEMS resonator according to the present invention may be determined using a variety of techniques including, for example, empirical and/or finite element modeling and simulation techniques (for example, a finite element modeling via a computer driven analysis engine such as FemLab, ANSYS, IDEAS and/or ABAKUS and/or empirical data/measurements). For example, a finite element modeling engine, using or based on a set of boundary conditions (for example, the size of the resonator structure), may be employed to determine and assess the dimensions, operation, characteristics and/or parameters of (i) outer radius of outer surface 12, (ii) inner radius of inner surface 14, and (iii) anchor support element 26, and/or (iv) impedance matching structure 28. Indeed, the impact and/or response of MEMS ring resonator structure 10*a* (including the anchor support element 26 and/or impedance matching structure 28) on or at substrate anchor 30 and/or substrate 16 may also be observed and/or determined using such a finite element modeling, simulation and analysis engine (see, for example, FIG. 5). Thus, as mentioned above, many of the properties of the structures of the present inventions may be optimized with Finite Element Modeling (FEM), which is also known as "FEA" or "FE Analysis".

Notably, an advantage of MEMS ring resonator 10 is the stress distribution during resonance. In this regard, MEMS ring resonator 10, at any given time during operation or motion, the stresses and/or strains on the ring structure are equal or substantially equal such that there are little to no locations or areas of MEMS ring resonator structure 10*a* that are exchanging the thermal energy (both hot and cold regions at any given moment). As such, MEMS ring resonator 10 is less susceptible to energy loss due to thermal elastic damping (TED) because there are few (if any) compressed regions/areas of the structure ("hot regions") and regions/areas of the structure under tension ("cold regions") within the same vicinity (and for a sufficient period of time) to allow exchange of thermal energy between the cold and warm regions. All areas and/or sections of MEMS ring resonator structure 10*a* move generally synchronous in and out in an expansion/compression (breathing) manner and, therefore, the stress/strain of the areas and/or sections of the ring structure is the same generally everywhere at any moment in time.

The MEMS ring resonator of the present inventions may be fabricated from well-known materials using well-known techniques. For example, the MEMS ring resonator may be fabricated from well-known semiconductors such as silicon, germanium, silicon-germanium or gallium-arsenide. Indeed, the MEMS ring resonator(s) may be comprised of, for example, materials in column IV of the periodic table, for example silicon, germanium, carbon; also combinations of these, for example, silicon germanium, or silicon carbide; also of III-V compounds, for example, gallium phosphide, aluminum gallium phosphide, or other III-V combinations; also combinations of III, IV, V, or VI materials, for example, silicon nitride, silicon oxide, aluminum carbide, aluminum nitride, and/or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS ring resonator according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure may be formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

The MEMS ring resonator 10 of the present invention may be packaged using a variety of techniques and materials, for example, thin film techniques, substrate bonding techniques (for example, bonding semiconductor or glass-like substrates) and prefabricated package (for example, a TO-8 "can"). Indeed, any packaging and/or fabricating techniques may be employed, whether now known or later developed; as such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867; and (3) "Microelectromechanical Systems Having Trench Isolated Contacts, and Methods of Fabricating Same", which was filed on Jun. 4, 2003 and assigned Ser. No. 10/455,555.

The inventions described and illustrated in the aforementioned patent applications may be employed to fabricate MEMS resonator of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein.

In the claims, the term "ring resonator structure" means a circular inner and outer surface (including circular within manufacturing tolerances) wherein the radius of curvature of the outer surface and the radius of curvature of the inner surface may include tolerances such that the radius of curvature of a surface or region is not constant but may vary between different areas of regions of the ring structure. Further, in the claims, the term, "elongating/compressing mode" means an elongating/compressing mode or a breathing mode or primarily or substantially an elongating/compressing or a breathing mode.

The above embodiments of the present invention are merely exemplary. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description.

What is claimed is:

1. A MEMS ring resonator, comprising:
    a MEMS ring resonator structure including:
        an outer surface, wherein the outer surface includes a circular or substantially circular shape having an outer radius of curvature; and
        an inner surface, wherein the inner surface includes a circular or substantially circular shape having an inner radius of curvature;
    an anchor support element including an impedance matching structure; and
    a coupling beam, disposed between the impedance matching structure and the outer surface of the MEMS ring resonator structure;
    wherein:
        in operation, the MEMS ring resonator structure oscillates in an elongating/compressing mode; and
        the impedance matching structure, in operation, resonates in a flexure mode.

2. The MEMS ring resonator of claim 1 wherein the impedance matching structure is a beam that extends from the outer surface.

3. The MEMS ring resonator of claim 2 wherein the beam, in operation, resonates in a bulk-elongation mode.

4. The MEMS ring resonator of claim 3 wherein the MEMS ring resonator structure includes a length and wherein the beam includes a length that is or is about one fourth of the length of the MEMS ring resonator structure.

5. The MEMS ring resonator of claim 3 further including at least one substrate anchor connected to a distal end of the impedance matching structure to secure the impedance matching structure to the substrate.

6. The MEMS ring resonator of claim 1 wherein the impedance matching structure flexes in-phase with the oscillation of the MEMS ring resonator structure.

7. The MEMS ring resonator of claim 1 further including at least one substrate anchor connected to a distal end of the impedance matching structure to secure the impedance matching structure to the substrate.

8. A MEMS ring resonator, comprising:
    a MEMS ring resonator structure including:
        an outer surface, wherein the outer surface includes a circular or substantially circular shape having a radius of curvature; and
        an inner surface, wherein the inner surface includes a circular or substantially circular shape having a radius of curvature;
    an anchor support element including an impedance matching structure, wherein the impedance matching structure is a beam that extends from the outer surface;
    at least one sense electrode;
    at least one drive electrode, wherein the sense and drive electrodes are juxtaposed one of the surfaces of the MEMS ring resonator structure; and
    sense circuitry, coupled to the sense electrodes, to provide an output signal;
    wherein, in operation, the MEMS ring resonator structure oscillates in an elongating/compressing mode.

9. The MEMS ring resonator of claim 8 wherein the at least one sense electrode provides one or more signals to the sense circuitry which, in response, provides a differential output signal.

10. The MEMS ring resonator of claim 8 wherein the at least one sense electrode provides one or more signals to the sense circuitry which, in response, provides a single ended output signal.

11. The MEMS ring resonator of claim 8 wherein the beam, in operation, resonates in a bulk-elongation mode.

12. The MEMS ring resonator of claim 11 wherein the MEMS ring resonator structure includes a length and wherein the beam includes a length that is or is about one fourth of the length of the MEMS ring resonator structure.

13. The MEMS ring resonator of claim 11 further including at least one substrate anchor connected to a distal end of the impedance matching structure to secure the impedance matching structure to the substrate.

14. A MEMS ring resonator, comprising:
a MEMS ring resonator structure including:
- an outer surface, wherein the outer surface includes a circular or substantially circular shape having a radius of curvature; and
- an inner surface, wherein the inner surface includes a circular or substantially circular shape having a radius of curvature;

an anchor support element including an impedance matching structure;
a coupling beam, disposed between the impedance matching structure and the outer surface of the MEMS ring resonator structure, wherein the impedance matching structure, in operation, resonates in a flexure mode;
at least one sense electrode;
at least one drive electrode, wherein the sense and drive electrodes are juxtaposed one of the surfaces of the MEMS ring resonator structure; and
sense circuitry, coupled to the sense electrodes, to provide an output signal;
wherein, in operation, the MEMS ring resonator structure oscillates in an elongating/compressing mode.

15. The MEMS ring resonator of claim 14 wherein the impedance matching structure flexes in-phase with the oscillation of the MEMS ring resonator structure.

16. The MEMS ring resonator of claim 14 further including at least one substrate anchor connected to a distal end of the impedance matching structure to secure the impedance matching structure to the substrate.

17. The MEMS ring resonator of claim 14 further including a plurality of substrate anchors wherein each distal end of the impedance matching structure is attached to a substrate anchor to secure the impedance matching structure to the substrate.

18. The MEMS ring resonator of claim 14 wherein the impedance matching structure includes a beam having a length that is or is about one fourth of the length of the MEMS ring resonator structure and wherein, in operation, the beam flexes in-phase with the oscillation of the MEMS ring resonator structure.

* * * * *